(12) United States Patent
Riggs et al.

(10) Patent No.: US 10,366,869 B2
(45) Date of Patent: Jul. 30, 2019

(54) ACTIVE FEEDBACK CONTROL OF SUBSYSTEMS OF A PROCESS MODULE

(71) Applicant: Lam Research Corporation, Fremont, CA (US)

(72) Inventors: Scott Riggs, San Francisco, CA (US); Ryan Bise, Campbell, CA (US); John Valcore, Fremont, CA (US); Eric Hudson, Berkley, CA (US); Ranadeep Bhowmick, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 80 days.

(21) Appl. No.: 15/818,590

(22) Filed: Nov. 20, 2017

(65) Prior Publication Data
US 2019/0157039 A1 May 23, 2019

(51) Int. Cl.
*H01J 37/32* (2006.01)
*G06F 1/12* (2006.01)
*G06F 1/08* (2006.01)

(52) U.S. Cl.
CPC ............ *H01J 37/3299* (2013.01); *G06F 1/08* (2013.01); *G06F 1/12* (2013.01)

(58) Field of Classification Search
CPC ........... H01J 37/3299; G06F 1/12; G06F 1/08
See application file for complete search history.

(56) References Cited

U.S. PATENT DOCUMENTS

| | | |
|---|---|---|
| 5,341,091 A | 8/1994 | Kurita |
| 6,323,714 B1 | 11/2001 | Naffziger et al. |
| 8,485,128 B2 | 7/2013 | Kellogg et al. |
| 8,826,885 B2 | 9/2014 | Kellogg et al. |
| 8,847,495 B2 | 9/2014 | de la Llera et al. |
| 2003/0105607 A1 | 6/2003 | Jones et al. |
| 2008/0226004 A1 | 9/2008 | Oh |
| 2014/0045489 A1 | 2/2014 | Josso |
| 2017/0084432 A1 | 3/2017 | Valcore, Jr. et al. |

OTHER PUBLICATIONS

Commissioner _ Notification of Transmittal of the Written Opinion of the International Searching Authority, or the Declaration _ dated Mar. 4, 2019_14 pages.

*Primary Examiner* — Stefan Stoynov
(74) *Attorney, Agent, or Firm* — Penilla IP, APC

(57) ABSTRACT

A communications system for synchronizing control signals between subsystems coupled to a process module used for processing a substrate. A distributed controller coupled to the subsystems is configured to initiate process steps, each step having a step period. A distributed clock module includes a master clock having a clock speed including clock cycles, each clock cycle having a duration that is pre-correlated to a feedback loop within which synchronized control signals are delivered to and received from the subsystems by the distributed clock module. A predefined number of clock cycles is assigned by the distributed clock module for performing a corresponding number of feedback loops for transitioning between process steps. The predefined number of clock cycles are restricted to a fraction of the step period.

30 Claims, 14 Drawing Sheets

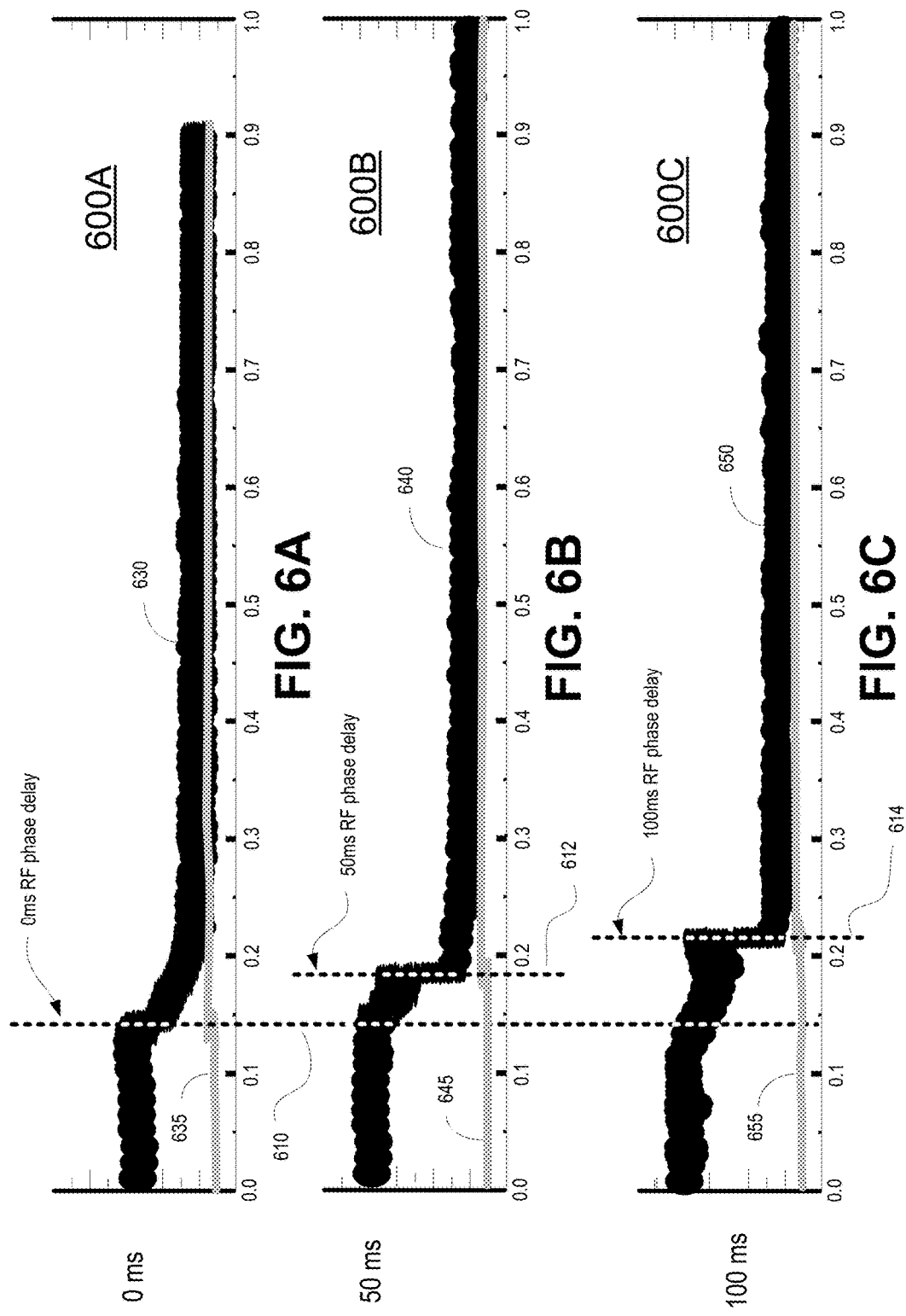

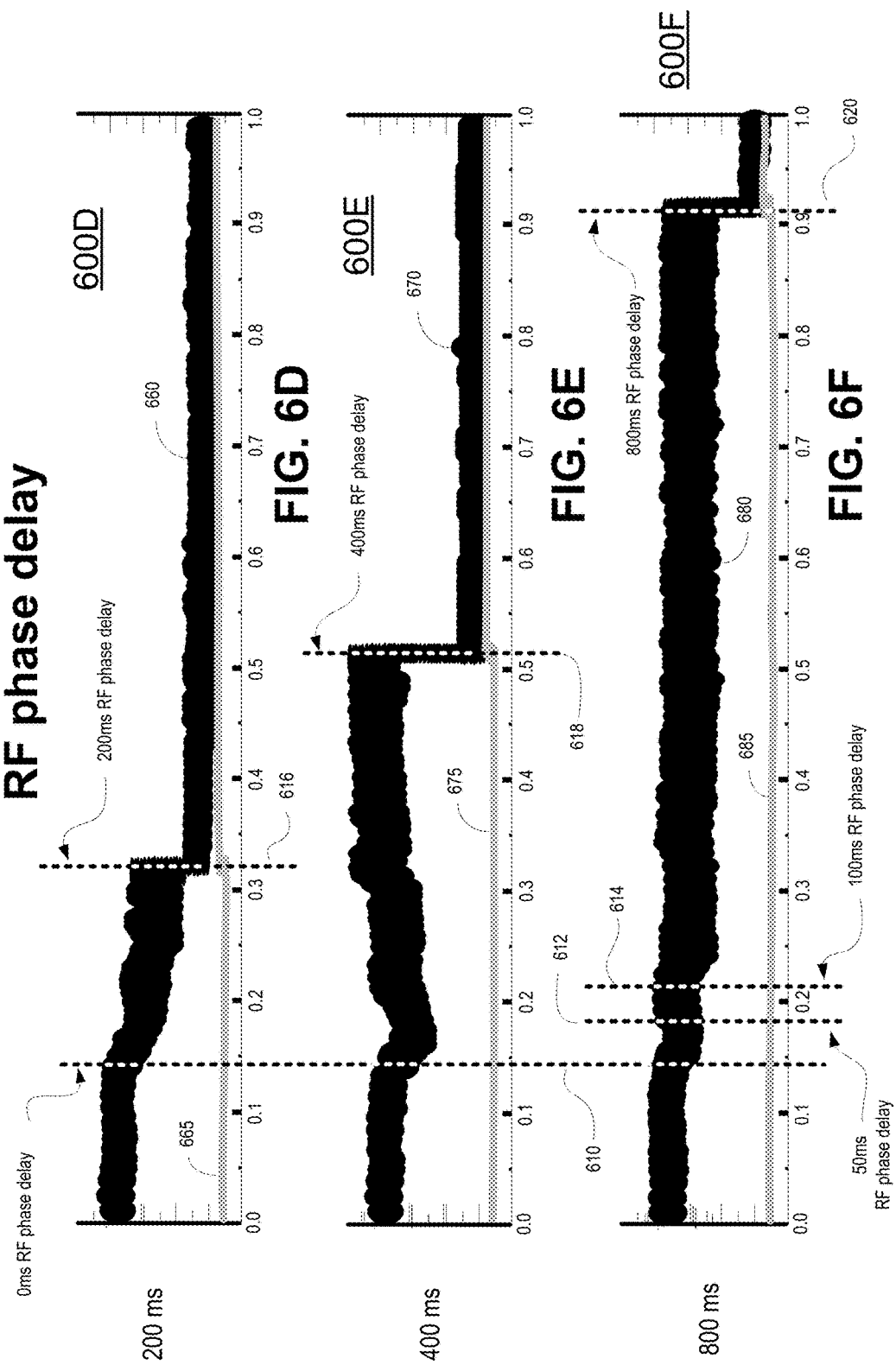

ACTIVE FEEDBACK CONTROL OF SUBSYSTEMS OF A PROCESS MODULE

CROSS REFERENCE TO RELATED APPLICATIONS

This application is related to U.S. Pat. No. 8,485,128, entitled "MOVABLE GROUND RING FOR A PLASMA PROCESSING CHAMBER," filed on Jun. 30, 2010, the disclosure of which is hereby incorporated by reference in its entirety. This application is related to U.S. Pat. No. 8,847,495, entitled "MOVABLE GROUNDING ARRANGEMENTS IN A PLASMA PROCESSING CHAMBER AND METHODS THEREFOR," filed on Sep. 14, 2012, the disclosure of which is hereby incorporated by reference in its entirety. This application is related to U.S. Pat. No. 8,826,855, entitled "C-SHAPED CONFINEMENT RING FOR A PLASMA PROCESSING CHAMBER," filed on Jun. 30, 2010, the disclosure of which is hereby incorporated by reference in its entirety. This application is related to U.S. patent application Ser. No. 15/369,110, entitled "MULTIPLE CONTROL MODES," filed on Dec. 5, 2016, the disclosure of which is hereby incorporated by reference in its entirety.

TECHNICAL FIELD

The present embodiments relate to semiconductor substrate processing methods and equipment tools, and more particularly, synchronizing subsystems of a plasma process module (e.g., controlling and operating the subsystems at the same time and rate) and/or allowing time delays or phase control of the subsystems to achieve atomic layer precision when performing quasi atomic layer deposition (ALD) or quasi atomic layer etching (ALE) without using self-limiting reactions.

BACKGROUND

In a plasma system, different tool subsystems are implemented to perform deposition or etching of materials on a substrate. Control of these tool subsystems is achieved through a communications protocol used to send control signals to the tool subsystems. Unfortunately, the current communication protocol between tool subsystems results in delay and variance times. These delay and variance times are often too large (e.g., greater than one percent of the recipe step time) for precise phase and synchronization control of tool subsystems that are required for short (e.g., sub one second to five seconds) steps times used in complex recipe tuning algorithms. That is, the current communication protocol is insufficient for achieving atomic layer precision when performing quasi-ALD or quasi-ALE without using self-limiting reactions.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

It is in this context that disclosures arise.

SUMMARY

The present embodiments relate to solving one or more problems found in the related art, and specifically to achieve atomic layer precision when performing quasi-ALD or quasi-ALE without using self-limiting reactions by using a master clock for synchronizing communications to tool subsystems of a plasma process module (PM), and providing feedback control of the tool subsystems within one clock cycle of the master clock.

Embodiments of the disclosure include a communications system for synchronizing control signals between subsystems of a plasma process module. The plasma process module is used for depositing a material over a substrate located in the plasma process module, for example when performing ALD or ALE processes. The system includes a plurality of subsystems coupled to the plasma process module. Each of the plurality of subsystems includes a respective subsystem response time. The system includes a distributed controller coupled to each of the plurality of subsystems, wherein the distributed controller includes a master clock and slave clocks coupled to each subsystem. The distributed controller is configured to initiate a plurality of process steps, wherein each of the process steps has a step period. The system includes a distributed clock module including a master clock having a clock speed that includes a plurality of clock cycles. Each of the clock cycles has a duration that is pre-correlated to a feedback loop within which synchronized control signals are delivered to and received from the plurality of subsystems by the distributed clock module. In particular, the distributed clock module is configured to assign a predefined number of clock cycles for performing a corresponding number of feedback loops for transitioning between process steps. The predefined number of clock cycles are restricted to a fraction of the step period, wherein the step period includes one hundred fractions.

Embodiments of the disclosure include another communications system for synchronizing control signals between subsystems of a plasma process module. The plasma process module is used for depositing a material over a substrate located in the plasma process module, for example when performing ALD or ALE processes. The system includes a plurality of subsystems coupled to the plasma process module. Each subsystem has a respective subsystem response time. The system includes a distributed controller coupled to each of the plurality of subsystems, wherein the distributed controller includes a master clock and slave clocks coupled to each subsystem. The distributed controller is configured to initiate a plurality of process steps, wherein each of the process steps has a step period. In addition, the distributed controller includes a master clock having a clock speed that includes a plurality of clock cycles. Each clock cycle has a duration that is pre-correlated to a feedback loop within which synchronized control signals are delivered to and received from the plurality of subsystems by the distributed controller. The distributed controller is configured to assign a predefined number of clock cycles for performing a corresponding number of feedback loops for transitioning between process steps. The predefined number of clock cycles are restricted to a fraction of the step period, and the step period comprises one hundred fractions.

In another embodiment, a method for synchronizing control signals between subsystems of a plasma process module is disclosed. The method includes initiating a plurality of process steps by a distributed controller, wherein each of the process steps has a step period. The process steps being performed by a plurality of subsystems coupled to the plasma process module. The subsystems are controlled by synchronized control signals, wherein each of the plurality of subsystems having a respective subsystem response time. The method includes configuring a master clock having a clock speed that includes a plurality of clock cycles. Each clock cycle has a duration that is pre-correlated to a feedback loop within which the synchronized control signals are delivered to and received from the plurality of subsystems by the distributed controller. The method includes assigning a predefined number of clock cycles for performing a corresponding number of feedback loops for transitioning between process steps. The method includes restricting the predefined number of clock cycles to a fraction of the step period, wherein the step period comprises one hundred fractions.

These and other advantages will be appreciated by those skilled in the art upon reading the entire specification and the claims.

BRIEF DESCRIPTION OF THE DRAWINGS

The embodiments may best be understood by reference to the following description taken in conjunction with the accompanying drawings.

FIGS. 6A-6F illustrate the ability to synchronize the control of RF power and gas delivery with high resolution in a communications system configured for synchronizing control signals delivered to and received from subsystems of a plasma process module, in accordance with embodiments of the present disclosure.

DETAILED DESCRIPTION

Figure 1:
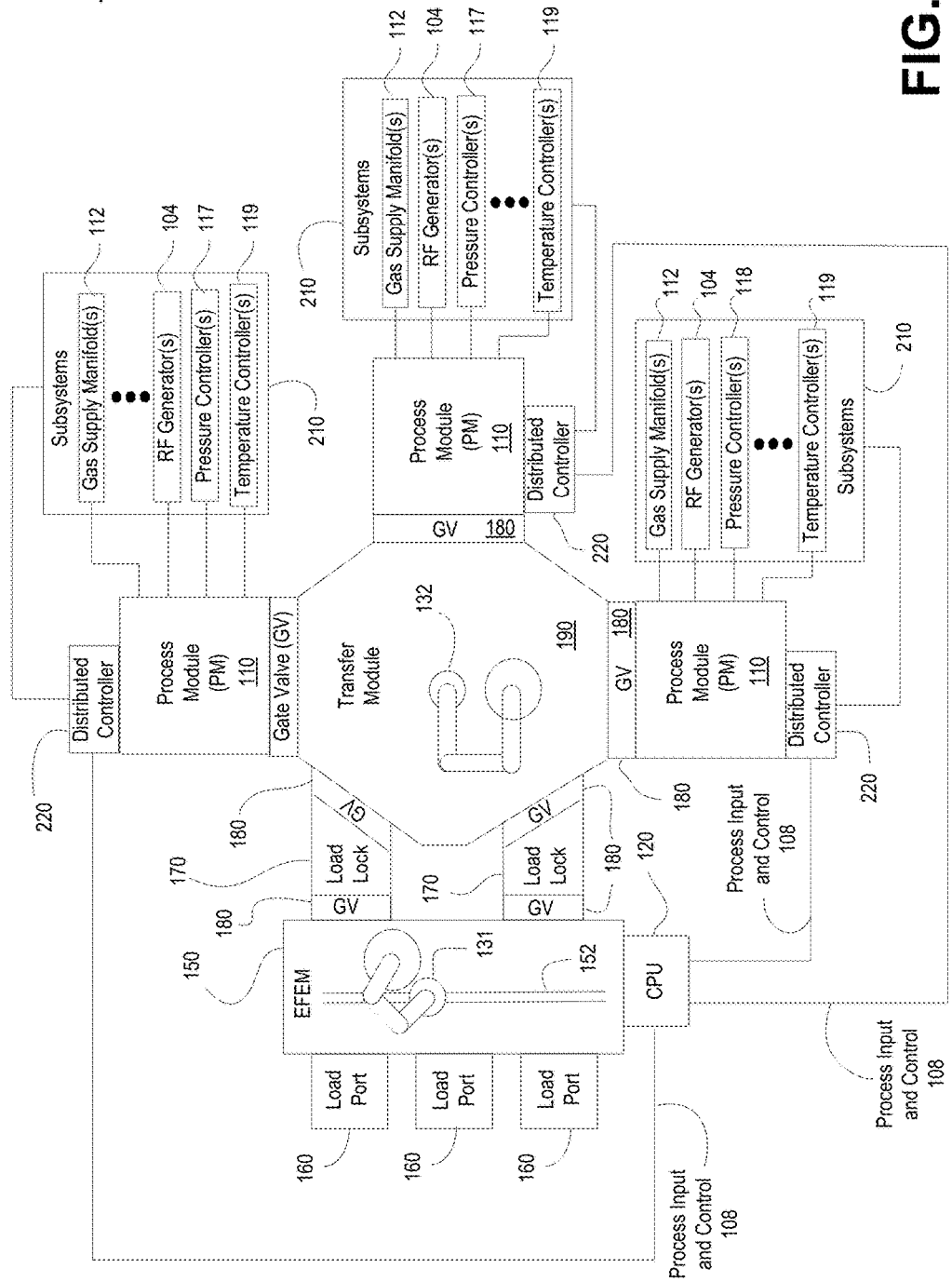
FIG. 1 illustrates a substrate processing system, which is used to process a wafer, e.g., to form films thereon.

Although the following detailed description contains many specific details for the purposes of illustration, anyone of ordinary skill in the art will appreciate that many variations and alterations to the following details are within the scope of the present disclosure. Accordingly, the aspects of the present disclosure described below are set forth without any loss of generality to, and without imposing limitations upon, the claims that follow this description.

Generally speaking, the various embodiments of the present disclosure describe systems and methods that provide for a reduction in delay and variance times when delivering control signals to tool subsystems of a plasma process module (PM) by using a communications system configured to deliver and receive synchronized control signals to and from the tool subsystems. The delay and variance times are reduced to levels (e.g., bringing sub-system delay times below 3-5 percent, such as 1 percent, of the recipe step time) that allow precise phase and synchronization control of the tool subsystems for short step times (e.g., sub one-second) to enable greater process capabilities, such as when implementing complex recipe tuning algorithms for ALD and ALE processes. In that manner, embodiments of the present disclosure are capable of performing quasi-ALD and quasi-ALE processes with shorter step times resulting in atomic layer precision and without using self-limiting reactions. In particular, this allows for increased uniformity of deposition and activation layers for more precise quasi-ALD and quasi-ALE processes. This allows the processes to hit the peak of the activation curve in order to maximize throughput, while using the least amount of reactant. Furthermore, this results in the ability to apply advanced recipe process controls with an increase in repeatability. In particular, embodiments of the present disclosure provide for decreases in gas exchange times, and allow for time-dependent tuning for RF synchronization and repeatability. In addition, embodiments of the present disclosure provide for the removal of delay time and jitter from tool subsystems of a plasma PM. Further, embodiments of the present disclosure provide for fine tune control of tool subsystems, such as fine tune control of amplitude and phase (e.g., timing start/stop of subsystems). For example, the amplitude (e.g., watts) of the RF power applied from low power generators may be controlled, and the phase of the RF power (e.g., when to turn on or off the RF power, in relation to the application of a gas chemistry) may be controlled and designed to follow a defined functional form. Furthermore, the function (e.g., recipe tuning algorithms) can be modified based off of tool input sensor data. Further, embodiments of the present disclosure allow for fine tune control of tool subsystems to create complex recipe algorithms for quasi-ALD and quasi-ALE processes. For example, embodiments provide for recipe control and synchronization of multiple subsystems on a microsecond time-scale to reduce sub-system delay time to below 3-5 percent (e.g., 1 percent) of the recipe step time (e.g., allowing for implementation of advanced recipe tuning algorithms that allow for sub one-second process steps, such as activation and deposition) during quasi-ALD and quasi-ALE processes.

With the above general understanding of the various embodiments, example details of the embodiments will now be described with reference to the various drawings. Similarly numbered elements and/or components in one or more figures are intended to generally have the same configuration and/or functionality. Further, figures may not be drawn to scale but are intended to illustrate and emphasize novel concepts. It will be apparent, that the present embodiments may be practiced without some or all of these specific details. In other instances, well-known process operations have not been described in detail in order not to unnecessarily obscure the present embodiments.

Embodiments of the present disclosure relate to methods and apparatuses for performing precise phase and synchronization control of the tool subsystems coupled to a plasma PM of a plasma processing system to reduce sub-system delay times below one-percent of the recipe step time (e.g., allowing for short step times —sub one-second) to enable greater process capabilities, such as when implementing complex recipe tuning algorithms for ALD and ALE processes. Embodiments of the present disclosure may be implemented in various process module configurations. Further, embodiments of the present disclosure are not limited to the examples provided herein, and may be practiced in different plasma processing systems employing different configurations, geometries, and plasma-generating technologies (e.g., inductively coupled systems, capacitively coupled systems, electron-cyclotron resonance systems, microwave systems, etc.). Examples of plasma processing systems and plasma process modules are disclosed in commonly owned U.S. Pat. Nos. 8,862,855, and 8,847,495, and 8,485,128, and U.S. patent application Ser. No. 15/369,110, each of which being previously introduced and incorporated by reference.

FIG. 1 illustrates a plasma processing system 100, which is used to process a wafer, e.g., to form films over substrates, such as those formed in quasi-ALD and quasi-ALE processes having atomic layer precision and without using self-limiting reactions. System 100 is configured to process wafers to produce semiconductor devices, for example. Front opening unified pods (FOUPs) (not shown) are configured for holding one or more wafers and for moving wafers into, within, and out of system 100. In particular, a wafer may be transferred within a FOUP between an equipment front-end module (EFEM) 150 and a respective process module 110 via a transfer module 190 during processing. Load ports 160 are configured for moving wafers to and from the EFEM 150 during pre-processing and post-processing.

The EFEM 150 is configured for moving wafers between the atmosphere and vacuum (the processing environment of the PM 110). EFEM 150 is configured for moving wafers between the FOUP and the load-locks. 170. Transfer robots 131 (e.g., robot arms and the like) transfer wafers between load ports 160 and appropriate load locks 170 along track 152. Various gate valves 180 in combination with load locks 170 may be employed to maintain or create appropriate pressures (e.g., atmosphere, vacuum, and transitions between the two). Gate valves 180 are configured to isolate components during movement and/or processing of wafers, especially when wafers are exposed to various pressures in system 100. For instance, gate valves 180 may isolate the EFEM 150, load locks 179, transfer module 190 and process modules 110. Load locks 170 include transfer devices to transfer substrates (e.g., wafers in FOUPs) from the EFEM 150 to the transfer module 190. The load locks 170 may be evacuated under pressure before accessing a vacuum environment maintained by the transfer module 190, or may be vented to atmosphere before accessing the EFEM 150. For example, load locks 170 may be coupled to a vacuum source (not shown) so that, when gate valves 180 are closed, load locks 170 may be pumped down. As such, the load locks 170 may be configured to maintain a desired pressure, such as when transferring wafers under vacuum pressure between the load locks 170 and the transfer module 190, or when transferring wafers under atmospheric pressure between the load locks 170 and the EFEM 150.

The transfer module 190 is configured to transfer substrates (e.g., wafers in the load locks 170) to and from the process modules 110 via gate valves 180. In one configuration, the gate valves 180 include controllable openings (e.g., access doors) allowing access to the adjacent modules (e.g., transfer module 190, EFEM 150, process module 110, etc.). Within the transfer module 190, transfer robots 132 (e.g., robot arms and the like) are configured to move wafer within the vacuum environment, such as transferring wafers between process modules 110, or to and from the load locks 170. The transfer module 190 and the process modules 110 typically operate under vacuum, and may be coupled with one or more vacuum source(s) (not shown) to maintain the appropriate vacuum pressure.

Central processing unit (CPU) 120 (e.g., a processor) is configured to manage the movement of wafers throughout system 100 via process input and control signals 108 to each of the components in system 100. For example, CPU 120 manages the movement of wafers between the load ports 160, EFEM 150, load locks 170, transfer module 190 and process modules 110. Not all communication connections are shown between CPU 120 and each of the components in system 100. In addition, CPU 120 is configured to provide general process instructions to each of the process modules 110 via the process input and control signals 108. For example, the instructions may be to perform a quasi-ALD process, quasi-ALE process, deposition process, activation process, etc. Process input and control signals 108 may include more detailed process recipes, such as power levels, timing parameters, process gasses, mechanical movement of the wafer, etc., such as to deposit or form films over the wafer. Once instructed, the process modules 110 are configured to manage the processes conducted within the chamber as implemented by the various subsystems and as controlled by a distributed controller, as will be described further below. For example, the process modules 110 each contain a chamber which may be used to process a wafer (e.g., deposit films over substrates, such as those formed in ALD processes). Heaters may be used to control temperature within the chamber for uniformity or custom settings. The chamber may be placed under vacuum (e.g., low pressure) at various times using a vacuum pump. The chamber may include a pedestal electrically coupled to a power supply as controlled by a controller or control module executing process input and control. In particular, the pedestal is configured to support a wafer. Means for receiving and removing a wafer from the pedestal may include lift pins, lift pads, etc. to allow an end-effector to pick up the wafer from the pedestal and/or lower the wafer to the pedestal. Gas supply manifold(s) connected to process gasses may be delivered to the chamber via gas supply manifold(s) as controlled by the control module. Gasses are distributed through the chamber via a showerhead, for example, situated above the wafer supported by the pedestal, and taken out of the chamber via a vacuum pump and outlet. Appropriate valving and mass flow control mechanism may be employed to ensure correct gasses are delivered during deposition and plasma treatment phases of the process. That is, process input and control within the chamber as implemented by the control module may include process recipes, such as power levels, timing parameters, process gasses, mechanical movement of the wafer, etc., such as those used to deposit or form films over a wafer.

One or more process modules 110 may be coupled to the transfer module 190. Each of the process modules 110 are configured to process wafers, or any suitable object requiring processing in a vacuum or other controlled environment. For example, the process modules 110 may be configured to implement one or more semiconductor manufacturing processes. In one configuration, the process modules 110 include a plasma processing chamber. In general, the process modules 110 can rely on a variety of mechanisms to generate plasma, such as inductive coupling (transformer coupling), helicon, electron cyclotron resonance, capacitive coupling (parallel plate). For instance, high density plasma can be produced in a transformer coupled plasma (TCPTM) processing chamber, or in an electron cyclotron resonance (ECR) processing chamber. An example of a high-flow plasma processing chamber or process module that can provide high density plasma is disclosed in commonly-owned U.S. Pat. No. 5,948,704, the disclosure of which is hereby incorporated by reference. For illustration of chambers located in process modules, parallel plate plasma processing chambers, electron-cyclotron resonance (ECR) plasma processing chambers, and transformer coupled plasma (TCPTM) processing chambers are disclosed in commonly-owned U.S. Pat. Nos. 4,340,462; 4,948,458; 5,200,232 and 5,820,723, the disclosures of which are hereby incorporated by reference.

One or more tool subsystems are coupled to a respective process module 110. The tool subsystems are configured to perform specific functions, as further described below, and collectively implement the processes performed within the process module 110 for processing a wafer, such as semiconductor manufacturing processes. The processes include plasma enhanced chemical vapor deposition (PECVD), sputter deposition, resist strip, plasma etching, plasma deposition, plasma processing, etc. In particular, plasma is generated by subjecting suitable process gasses in the process module 110 to radio frequency (RF) power. The flow of RF power and/or current in the process module 110 affects the processing. The tool subsystems may include gas supply manifolds(s) 112, RF generator(s) 104, pressure controller (s) 118, temperature controller(s) 119, etc. A more detailed description of subsystems is provided in FIG. 9.

Figure 2A:
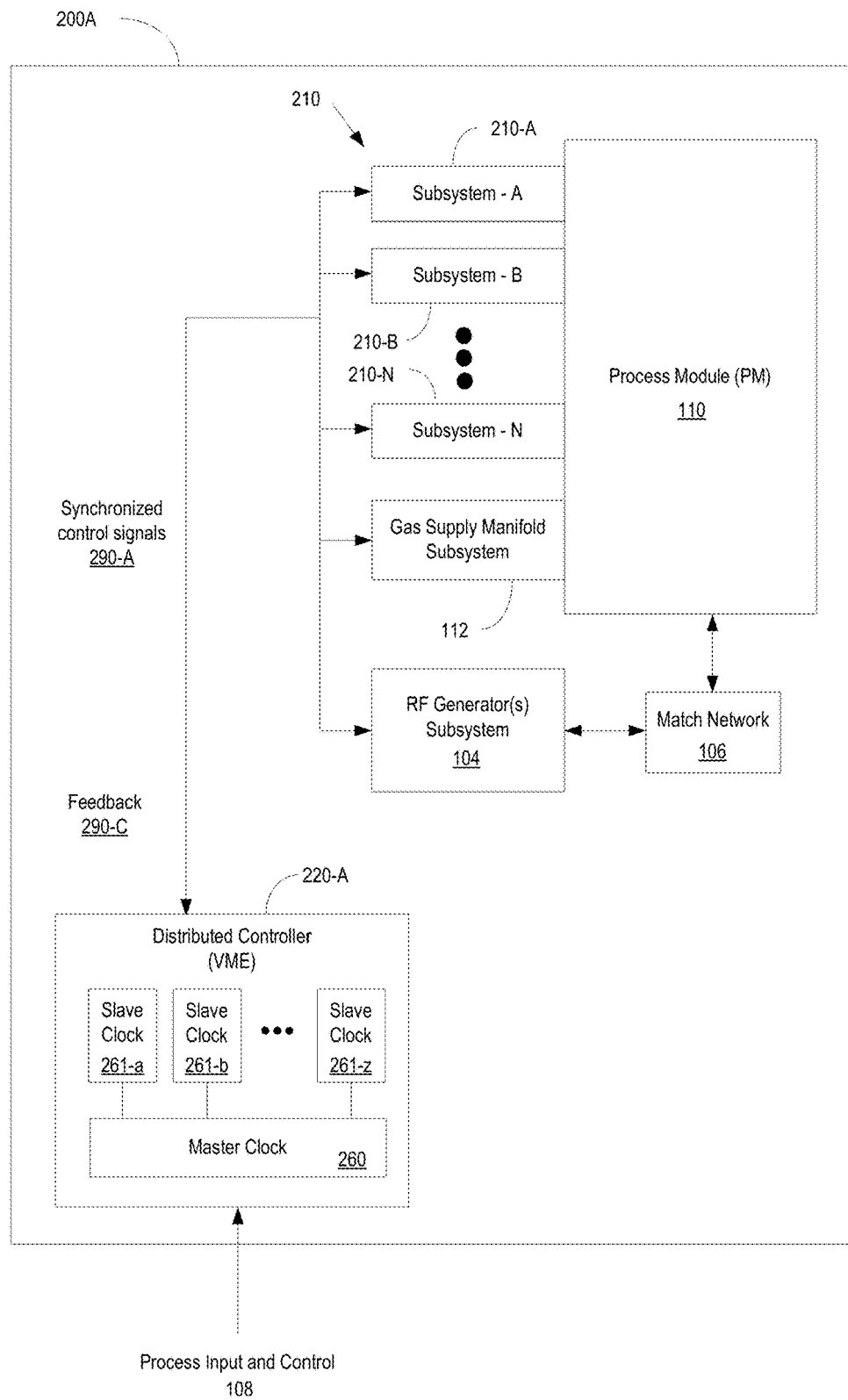
FIG. 2A illustrates a communications system configured for synchronizing control signals delivered to and received from subsystems of a plasma process module, wherein a distributed controller includes a master clock for synchronizing the control signals, the control signals being generated by the distributed controller, in accordance with one embodiment.

FIG. 2A illustrates a communications system 200A configured for synchronizing control signals delivered to and received from subsystems of a plasma process module 110, wherein the synchronized control signals are generated and synchronized within a distributed controller 220-A, in accordance with one embodiment of the present disclosure. The communications system 200A provides for improved film uniformity of deposition and activation layers for more precise quasi-ALD and quasi-ALE processes through the synchronization of control signals at a controlled clock speed of a master clock 260, wherein the master clock 260 controls all slave clocks 261a-261z, each of which is tied to a specific subsystem. The controlled clock speed of the master clock 260, in combination with the slave clocks 261a-261z, provide for reduced delay and variance times to deliver synchronized control signals to and from subsystems to perform quasi-ALD and quasi-ALE processes with shorter step times, thereby allowing for atomic layer precision without using self-limiting reactions. The controlled clock speed of the master clock 260 and the slave clocks 261a-261z provide for decreases in gas exchange times, allows for time-dependent tuning for RF synchronization and repeatability, provide fine-tuned and/or feedback control of tool subsystems (e.g., control of amplitude and phase), provide for complex recipe algorithms when performing quasi-ALD and quasi-ALE processes, and provide for synchronization of multiple subsystems on a microsecond timescale to reduce sub-system delay times below 3-5 percent (e.g., one-percent) of the recipe step time thereby allowing for advanced recipe tuning algorithms (e.g., sub-one-second process steps).

As previously described, process module 110 is configured for processing wafers in a vacuum or controlled environment. For example, the process module 110 may be configured to implement one or more semiconductor manufacturing processes. In particular, process module 110 includes a plasma processing chamber for generating plasma used during the processes, such as quasi-ALD and quasi-ALE processes. For instance, process module 110 is configured for depositing a material over a substrate that is located in the process module 110, wherein the material may be deposited during a deposition process or an etching process, for example.

As shown, a plurality of subsystems 210 (e.g., subsystem 210-A, 210-B . . . 210N) is coupled to process module 110. In particular, the plurality of subsystems 210 includes gas supply manifold(s) subsystem 112, and RF generator(s) subsystem 104 (each RF generator being coupled to a corresponding match network 106 for shielding the process module 110 and/or RF generators from unwanted RF power), as will be further described in FIG. 3. Each of the plurality of subsystems 210 has a respective subsystem response time, within which control of a respective subsystem is achieved. The subsystem response times may be predefined. For instance, application of a specific level of RF power is achieved within a corresponding subsystem response time, wherein the subsystem includes one or more RF generators 104.

A distributed controller 220-A is configured to receive process input and control signals 108 (e.g., from CPU 120). The input and control signals 108 are configured to provide general process operating instructions to communication systems 200A. For instance, the input and control signals 108 may provide general process instructions for implementation within the process module 110, such as recipe information. For example, the instructions received by the distributed controller 220-A may include instructions for performing a quasi-ALD or quasi-ALE process within the process module 110. In other cases, the input and control signals 108 may be more detailed and include process recipes, such as power levels, timing parameters, process gasses, mechanical movement of the wafer, etc., such as to deposit or form films over the wafer. The distributed controller 220-A is configured for initiating a plurality of process steps in response to the input and control signals 108. In one embodiment, the distributed controller 220-A is a VME controller in compliance with the Versa Module Europa (VME) standard or its derivatives. For example, the VME standard may define a computer bus system, device, and network.

In addition, the distributed controller 220-A is coupled to each of the plurality of subsystems 210 (including gas supply manifold subsystem 112 and RF generator subsystem(s) 104), and is configured for initiating a plurality of process steps. Each of the process steps has a step period. In one embodiment, the step period for the process steps is uniform (e.g., 1 second, a fraction of a second, etc.). In another embodiment, each of the process steps may have a unique step period. That is, the distributed controller 220-A is configured for managing detailed operations and optimizing these operations in real time based on input sensor data (e.g., implementing the process steps) of each of the plurality of subsystems 210 (e.g., as delivered as feedback 290-C), in response to the instructions provided through the process input and control signals 108. For example, the distributed controller 220-A delivers control signals 290-A to one or more of the subsystems 210 at various times when performing the various process steps (e.g., activation, deposition, etc.), and receives feedback signals 290-C.

In one embodiment, the plurality of process steps collectively performs a deposition process with atomic layer precision without self-limiting reactions, such as in a quasi-ALD process. The quasi-ALD process includes an activation step wherein the surface of the substrate is chemically activated using the plasma, and a deposition step for depositing an atomic layer of a chemical, for example performed when depositing a material. In another embodiment, the plurality of process steps collectively performs an etching process with atomic layer precision without self-limiting reactions, such as in a quasi-ALE process. The quasi-ALE process includes an activation step wherein the surface of the substrate is chemically activated using the plasma, and an etching step for removing an atomic layer of a material, for example performed when depositing an etching material.

In particular, the distributed controller 220-A is configured to synchronize communications with each of the subsystems using the master clock 260. The master clock 260 simultaneously controls the plurality of slave clocks 261a-261z, wherein each slave clock is tied to a specific subsystem. For example, slave clock 261-a could be tied to subsystem-A (210-A), slave clock 261-b could be tied to subsystem-B (210-B), etc. In that manner, control signals directed to a particular subsystem (e.g., subsystem-A) as timed through its respective slave clock (e.g., slave clock 261-a) are synchronized with control signals directed to another subsystem (e.g., subsystem-B) as timed through its respective slave clock (e.g., slave clock 261-B). In that manner, all of the control signals directed to all of the subsystems are synchronized. The distributed controller 220-A further includes the master clock 260 having a clock speed that includes a plurality of clock cycles. Each of the clock cycles is of a duration that is pre-correlated to a feedback loop within which synchronized control signals are delivered to and received from the plurality of subsystems 210 by the distributed controller 220-A. As such, one feedback loop may be performed at least within one clock cycle of the master clock 260. In that manner, the distributed controller 220-A provides the master clock 260 that is of sufficient speed to increase time resolution for RF control, ALD valve control and control over each of the subsystems 210. The master clock 260 decreases timing delays, and jitter for each of the subsystems 210. As such, the master clock 260 allows for implementation of an RF tuning algorithm via a match-based model having improved time response, synchronization of subsystems, and improved RF control.

The distributed controller 220-A is further configured to assign a predefined number of clock cycles of the master clock 260 for performing a corresponding number of feedback loops for transitioning between process steps. In that manner, the transition to the next process step is improved by completing the transition within the predefined number of clock cycles and corresponding number of feedback loops. The predefined number of clock cycles provides for the subsystems 210 and process module 110 of communications system 200A to achieve each of the subsystem response times. This is possible because the control signals 290-A to each of the subsystems 210 are synchronized to the master clock 260. For example, the predefined number of clock cycles provide for a RF generator subsystem 104 to reach its desired RF power as applied within the process module 110. That is, multiple feedback loops may be performed when initiating a process step, or transitioning to a process step from a previous process step. In one embodiment, the multiple feedback loops correspond to a system response time (e.g., for all subsystems) that ensures that control of each of the subsystems 210 is achieved for a corresponding process step, or a portion of the corresponding process step. In one embodiment, the system response time is greater than the slowest subsystem response time.

In one embodiment, the predefined number of clock cycles are restricted to a fraction of the step period. In one instance, the step period comprises one hundred fractions. In another instance, the step period comprises a different number of fractions. As such, the fraction of the step period may define the predefined number of clock cycles of the master clock 260, and correspondingly the clock speed of the master clock 260. That is, the clock speed is based on the predefined number of clock cycles to be performed during the fraction of the step period. In one embodiment, the clock speed is determined or calculated by the inverse of the time required to perform one feedback loop. In another embodiment, the fraction of the step period to perform the corresponding number of feedback loops (in association with the predefined number of clock cycles) is one percent or less of the step period. In other embodiments, the fraction of the step period is ten percent or less of the step period.

Figure 2B:
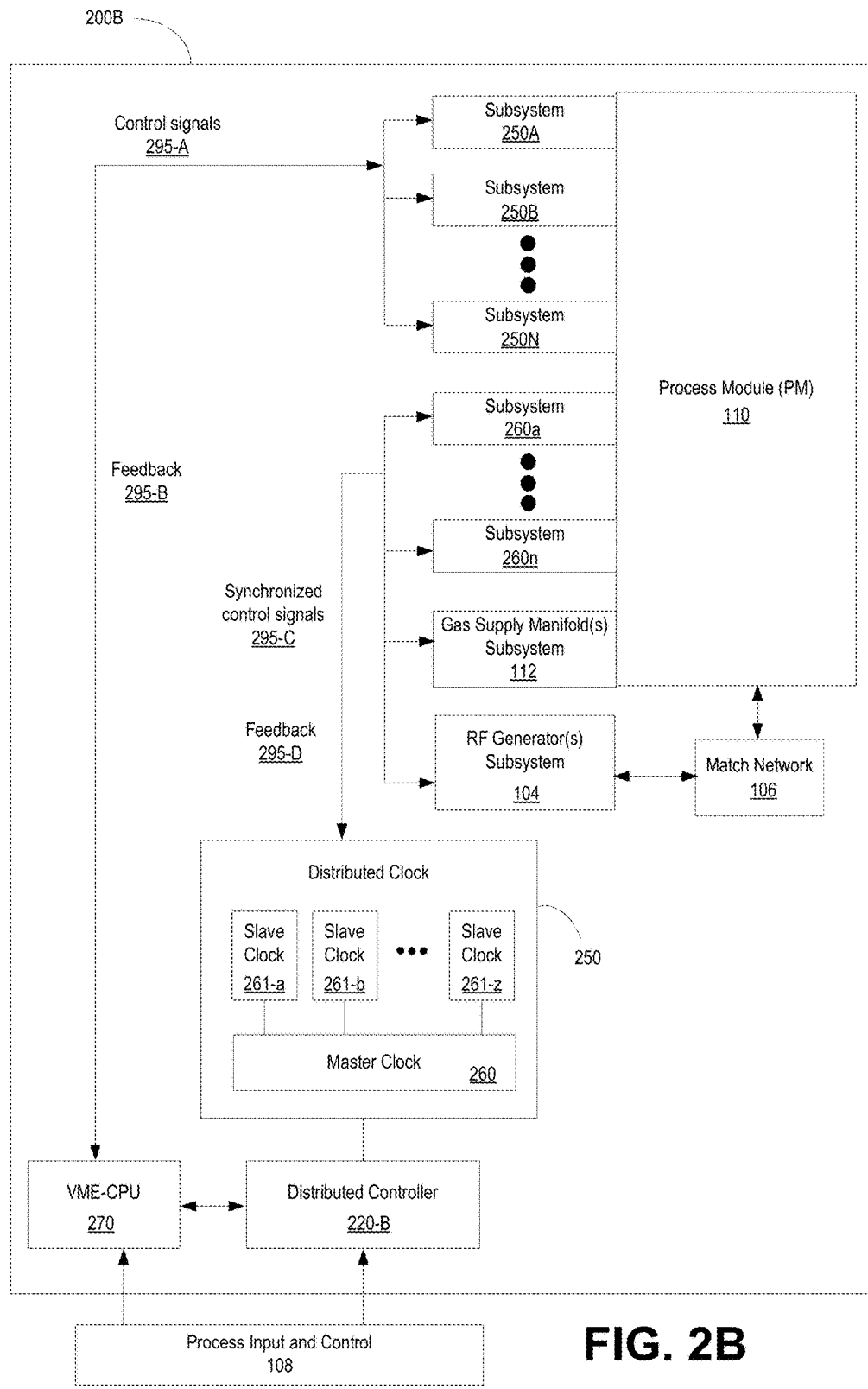
FIG. 2B illustrates a communications system configured for synchronizing control signals delivered to and received from subsystems of a plasma process module, wherein a distributed clock module includes a master clock for synchronizing the control signals, the control signals being generated by a distributed controller, in accordance with one embodiment.

FIG. 2B illustrates a communications system 200B configured for synchronizing control signals delivered to and received from subsystems of a process module 110, wherein the one or more control signals 295-C, and corresponding feedback control signals 295-D, are controlled and synchronized within a distributed clock module 250 in combination with a distributed controller 220-B, in accordance with one embodiment of the present disclosure. The communications system 200A provides for improved film uniformity of deposition and activation layers for more precise quasi-ALD and quasi-ALE processes through the synchronization of control signals at controlled clock speeds at a controlled clock speed of a master clock 260, wherein the master clock 260 controls all slave clocks 261a-261z, each of which is tied to a specific subsystem. The controlled clock speed of the master clock 260, in combination with the slave clocks 261a-261z, provide for reduced delay and variance times to deliver synchronized control signals to and from subsystems to perform quasi-ALD and quasi-ALE processes with shorter step times, thereby allowing for atomic layer precision without using self-limiting reactions. The controlled clock speed of the master clock 260 and the slave clocks 261a-261z provide for decreases in gas exchange times, allows for time-dependent tuning for RF synchronization and repeatability, provide fine-tuned and/or feedback control of tool subsystems (e.g., control of amplitude and phase), provide for complex recipe algorithms when performing quasi-ALD and quasi-ALE processes, and provide for synchronization of multiple subsystems on a microsecond timescale to reduce sub-system delay times below 3-5 percent (e.g., 1 percent) of the recipe step time thereby allowing for advanced recipe tuning algorithms (e.g., sub-one-second process steps).

As previously introduced in FIGS. 1 and 2A, process module 110 is configured for processing wafers in a vacuum or controlled environment. For example, the process module 110 may be configured to implement one or more semiconductor manufacturing processes. For example, process module 110 includes a plasma processing chamber for generating plasma to facilitate various processes that include the depositing of a material during a deposition or etching process, such as quasi-ALD and quasi-ALE processes.

As shown in FIG. 2B, a plurality of subsystems is coupled to process module 110. The subsystems include subsystems 250A-250N, subsystems 260a-260n, gas supply manifold(s) subsystem 112, and RF generator(s) subsystem 104 (each RF generator coupled to a corresponding match network 106). Each of the plurality of subsystems has a respective subsystem response time, within which control of a respective subsystem is achieved, wherein the response times may be predefined.

A VME-CPU 270 and distributed controller 220-B are each configured to receive process input and control signals 108 (e.g., from CPU 120). The input and control signals 108 are configured to provide general process operating instructions to communication systems 200B. For instance, the input and control signals 108 may provide general process instructions for implementation within the process module 110, such as recipe information. For example, the instructions received by the VME-CPU 270 and distributed controller 220-B may include instructions for performing a quasi-ALD or quasi-ALE process within the process module 110. The process input and control signals 108 may be more detailed and include process recipes, such as power levels, timing parameters, process gasses, mechanical movement of the wafer, etc., such as to deposit or form films over the wafer. The VME-CPU 270 and distributed controller 220-B are configured for initiating a plurality of process steps in response to the input and control signals 108. In one embodiment, the distributed controller 220-B is a VME controller in compliance with the VME standard or its derivatives.

VME-CPU 270 is coupled to subsystems 250A-250N. As such, VME-CPU 270 initiates process steps for these subsystems 250A-250N (e.g., temperature control, pressure control, etc.) in response to the received input and control signals 108. In one embodiment, the clock speed of the VME-CPU 270 is sufficient for performing phase and synchronization control of the subsystems 250A-250N. As shown, VME-CPU 270 issues control signals 295-A to one or more of subsystems 250A-250N, and receives feedback signals 295-B for optimizing the control signals 295-A in real time.

In one embodiment, the distributed controller 220-B may be configured within a legacy plasma processing system, wherein the clock speed of the VME-CPU 270 is insufficient for performing precise phase and synchronization control of certain tool subsystems coupled to a process module 110 for implementing short step times (e.g., sub-on-second). For example, the RF generator(s) subsystem 104, gas supply manifold(s) subsystem 112, and other subsystems (e.g., subsystems 260-a through 260-n) may require more controlled clock speeds than that provided by the VME-CPU 270. As such, communications system 200-B includes a distributed clock module 250 coupled to the distributed controller 220-B which is coupled to the VME-CPU 270. The distributed controller 220-B is configured for initiating process steps for subsystems 260a through 260n, RF generator(s) subsystem 104 and gas supply manifold(s) subsystem 112. The distributed clock module 250 includes the master clock 260 used for synchronizing control signals 295-C, wherein the master clock 260 controls all slave clocks 261a-261z used for communication between the distributed controller 220-B and the subsystems requiring more precise synchronization and phase control. The new clock speed of the master clock 260 is now sufficient to perform precise phase and synchronization control of the connected subsystems 260a-260n, RF generator(s) subsystem 104 and gas supply manifold(s) subsystem 112 to enable greater process capabilities, such as when implementing complex recipe tuning algorithms for quasi-ALD and quasi-ALE processes. As shown, the distributed controller 220-B through respective slave clocks 261a-261z of the distributed clock module 250 is coupled to each of the subsystems 260a-260n, gas supply manifold(s) subsystem 112, and RF generator(s) subsystem 104 through a respective slave clock. That is, the distributed controller 220-B can be tied to all subsystems (e.g., as shown in FIG. 2A), or to selected subsystems (e.g., as shown in FIG. 2B). In that manner, the distributed controller 220-B through respective slave clocks is configured to initiate and implement each of the process steps for those subsystems. In one embodiment, the number of subsystems coupled to and controlled by the distributed controller 220-B is selectable by design. In addition, the distributed controller 220-B is configured to run with the VME-CPU 270 to initiate and implement the overall process steps. Each of the process steps has a step period. In one embodiment, the step period for the process steps is uniform (e.g., 1 second, a fraction of a second, etc.). In another embodiment, each of the process steps may have a unique step period.

That is, the distributed controller 220-B initiates and implements the process steps including establishing feedback loops to ensure the transition to the process steps is completed within a predefined transition period. In particular, the distributed controller 220-B is configured for managing detailed operations and optimizing these operations in real time based on input sensor data (e.g., implementing the process steps) of each of the subsystems 260a-260n, gas supply manifold(s) subsystem 112, and RF generator(s) subsystem 104 (e.g., as delivered as feedback 295-D), in response to process initiation provided from the distributed controller 220-B, which in turn is responding to general instructions provided through the process input and control signals 108. For example, the distributed controller 220-B through the distributed clock module 250 delivers synchronized control signals 295-C to one or more of the subsystems 210 at various times when performing the various process steps (e.g., activation, deposition, etc.) and receives feedback signals 295-D.

In one embodiment, the plurality of process steps performs a deposition process with atomic layer precision without self-limiting reactions, such as in a quasi-ALD process. The quasi-ALD process includes an activation step wherein the surface of the substrate is chemically activated using the plasma, and a deposition step for depositing an atomic layer of a chemical, for example performed when depositing a material. In another embodiment, the plurality of process steps performs an etching process with atomic layer precision without self-limiting reactions, such as in a quasi-ALE process. The quasi-ALE process includes an activation step wherein the surface of the substrate is chemically activated using the plasma, and an etching step for removing an atomic layer of a material, for example performed when depositing an etching material.

The distributed controller 220-B through the distributed clock module 250 is configured to synchronize communications with each of the subsystems using the master clock 260. The master clock 260 simultaneously controls the plurality of slave clocks 261a-261z, wherein each slave clock is tied to a specific subsystem (e.g., one of subsystems 260a-260n, gas supply manifold(s) subsystems 112, and RF generator(s) subsystem 104). For example, slave clock 261-a could be tied to subsystem 260a, slave clock 2610b could be tied to subsystem 260b, etc. In that manner, control signals directed to a particular subsystem (e.g., subsystem 260a) as timed through its respective slave clock (e.g., slave clock 261-a) are synchronized with control signals 295-C directed to another subsystem (e.g., subsystem 260b) as timed through it respective slave clock (slave clock 261-b). As such, all the control signals 295-C directed to subsystems 260a-260n, gas supply manifold(s) subsystems 112, and RF generator(s) subsystem 104 are synchronized. Further, the distributed controller 220-B includes the distributed clock module 250, which includes the master clock 260 having a clock speed that includes a plurality of clock cycles. Each of the clock cycles is of a duration that is pre-correlated to a feedback loop within which synchronized control signals are delivered to and received from the plurality of subsystems by the distributed controller 220-B. As such, one feedback loop may be performed at least within one clock cycle of the master clock 260. In that manner, the distributed controller 220-B utilizes the master clock 260 that is of sufficient speed to increase time resolution for any attached subsystem coupled via a respective slave clock. For example, RF control and ALD valve control is possible over corresponding subsystems, previously described. The master clock 260 decreases timing delays, and jitter for each of these subsystems. As such, the master clock 260 allows for synchronization of subsystems, and improved RF control.

The distributed controller 220-B is further configured to assign a predefined number of clock cycles of the master clock 260 for performing a corresponding number of feedback loops for transitioning between process steps. In that manner, the transition to the next process step is improved by completing the transition within the predefined number of clock cycles and corresponding number of feedback loops. That is, control of each of the subsystems is achieved within the corresponding number of feedback loops because the control signals to the subsystems are synchronized via respective slave clocks 261a-261z by the master clock 260.

As previously described, the predefined number of clock cycles are restricted to a fraction of the step period, wherein the step period comprises one hundred fractions, in one embodiment. In other embodiments, the step period comprises a different number of fractions. As such, the fraction of the step period may define the predefined number of clock cycles of the master clock 260, and correspondingly the clock speed of the master clock 260. That is, clock speed is based on the predefined number of clock cycles to be performed during the fraction of the step period. In one embodiment, the clock speed is determined or calculated by the inverse of the time required to perform one feedback loop. In another embodiment, the fraction of the step period to perform the corresponding number of feedback loops (in association with the predefined number of clock cycles) is one percent or less of the step period. In another embodiment, the fraction of the step period is five percent or less of the step period. In other embodiments, the fraction of the step period is ten percent or less of the step period.

Figure 3:
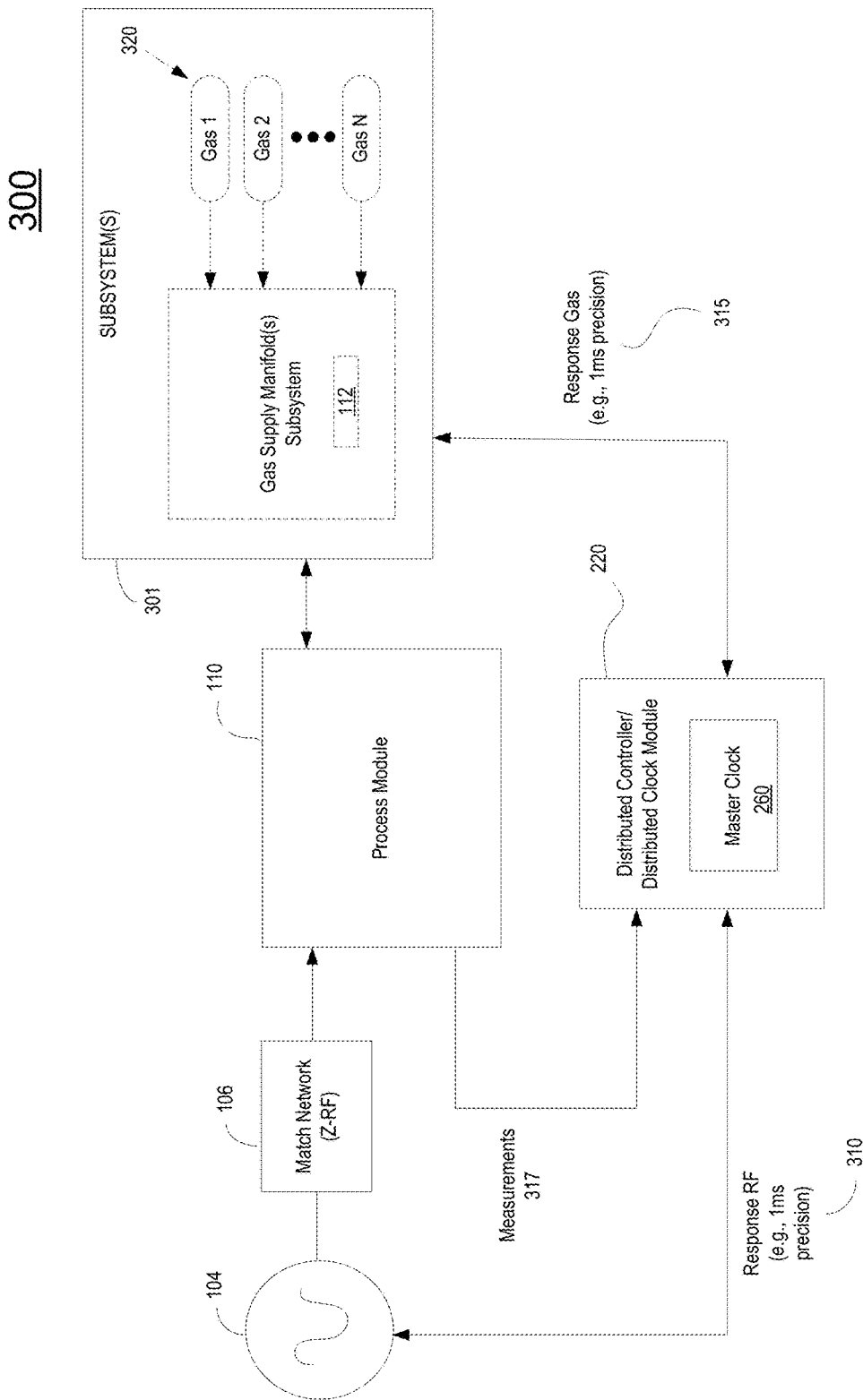
FIG. 3 illustrates feedback control of subsystem responses in a communications system configured for synchronizing control signals delivered to and received from subsystems of a plasma process module, in accordance with one embodiment of the present disclosure.

FIG. 3 illustrates feedback control of subsystem responses in a communications system 300 configured for synchronizing control signals delivered to and received from subsystems of a plasma process module, in accordance with one embodiment of the present disclosure. FIG. 3 may be implemented within communications system 200A of FIG. 2A or communications system 200B of FIG. 2B. One or more subsystem(s) 301 are coupled to process module 110 and controllable by the distributed controller 220. For purposes of brevity and clarity, subsystem(s) 301 and RF generator(s) subsystem 104 are shown coupled to process module 110. For purposes of illustration, gas supply manifold(s) subsystem 112 is shown as a representative subsystem within the subsystem(s) 301. As previously described, the subsystems 301 can be used for controlling processes implemented within the process module 110. The communications system 300 is configured for performing precise phase and synchronization control of the subsystems 301 coupled to the process module 110 to implement short step times, thereby enabling greater process capabilities, such as for implementing complex recipe tuning algorithms for quasi-ALD and quasi-ALE processes.

As previously introduced in FIGS. 1 and 2A, process module 110 of FIG. 3 is configured for processing wafers in a vacuum or controlled environment. For example, the process module 110 may be configured to implement one or more semiconductor manufacturing processes. For example, process module 110 includes a plasma processing chamber for generating plasma to facilitate various processes that include the depositing of a material during a deposition or etching process, such as quasi-ALD and quasi-ALE processes. The chamber may include one or more of electrodes, substrate support, electrostatic chuck in the substrate support (configured to include electrodes biased to a high voltage in order to induce an electrostatic holding force to hold the wafer in position), one or more gas showerheads, gap control mechanisms, for controlling the gap between the substrate support and the showerheads. For purposes of brevity and clarity, detailed descriptions of the various other components of the chamber and/or process module 110 that are known to those skilled in the art are not provided, but are contemplated and fully supported.

For purposes of brevity and clarity, exemplary communications system 300 includes two subsystems to illustrate the implementation of feedback control when transitioning between process steps, previously introduced. The subsystems include RF generator(s) 104 and gas supply manifold(s) 112 (representative of any of subsystem(s) 301). The distributed controller 220 is configured to initiate a plurality of process steps (e.g., in response to input and control signals 108). The distributed controller 220 may be implemented as a stand-alone controller 220-A as in FIG. 2A that includes a master clock 260 for synchronizing control signals, in one implementation. In another implementation, the distributed controller 220 may be implemented in a configuration that includes a distributed controller 220-B and a distributed clock module 250 as in FIG. 2B, wherein the distributed clock module 250 includes a master clock 260 for synchronizing control signals. In some embodiments, the control signals may include process recipes, such as power levels, timing parameters, process gasses, mechanical movement of the wafer, etc., such as to deposit or form films over the wafer.

For example, RF generator(s) subsystem 104 is coupled to the process module 110 via a match network 106, wherein the match network 106 is configured for controlling RF reflection throughout the communications systems 300. RF power is applied to process a substrate within the process module 110. In particular, the RF power is applied to ignite plasma within the process module 110 used for etching and/or deposition processes, wherein process gas(es) within the process module 110 are subjected to RF power from the RF generator(s) subsystem 104.

In addition, a gas supply manifold(s) subsystem 112 is coupled to the process module 110. The gas supply manifold(s) subsystem 112 is connected to process gasses 320 (e.g., gas 1, gas 2 . . . gas N), e.g., gas chemistries supplied from a facility.

Depending on the processing being performed, the distributed controller 220 controls the delivery of process gasses 320 via the gas supply manifold(s) subsystem 112. The chosen gasses are then flown into a shower head and distributed in a space volume defined between the showerhead and the wafer resting on a wafer support system. For example, in quasi-ALD or quasi-ALE processes, the gasses can be reactants chosen for performing activation or deposition process steps. Further, the gasses may be premixed or not. Appropriate valving and mass flow control mechanisms within the gas supply manifold(s) subsystem 112 may be employed to ensure that the correct gasses are delivered during the deposition and activation process steps. Process gasses exit chamber via an outlet (not shown). A vacuum pump (e.g., a one or two stage mechanical dry pump and/or a turbomolecular pump) draws process gasses out and maintains a suitably low pressure within the process module 110 by a closed loop controlled flow restriction device, such as a throttle valve or a pendulum valve within the gas supply manifold(s) subsystem 112.

The distributed controller 220 is configured to implement one or more feedback loops when transitioning between process steps as implemented by the RF generator(s) subsystem 104, gas supply manifold(s) subsystem 112, and process module 110. In particular, the distributed controller 220 is configured to synchronize communications with the subsystems, including RF generator(s) subsystem 104 and gas supply manifold(s) subsystem 112, using the master clock 260. Each clock cycle of the master clock 260 is pre-correlated to implementation of a feedback loop, within which control signals are delivered to and received from the respective subsystems, including the RF generator(s) subsystem 104 and gas supply manifold(s) subsystem 112. As such, one feedback loop may be performed at least within one clock cycle of the master clock 260.

As shown in FIG. 3, response signals are received by the distributed controller 220. For example, response RF signals 310 are received from the RF generator(s) subsystem 104, and may include whether RF power is applied and at what level is the RF power applied at a particular point in time. In addition, response gas signals 315 are received from the gas supply manifold(s) subsystem 112, and may include whether valves are open for delivery of corresponding gasses. In one embodiment, the response signals 310 and 315 are delivered with 1 ms (millisecond) precision. In addition, measurements 317 may be delivered from process module 110 to distributed controller 220. These measurements 317 may be collected from sensors attached to or located within the process module 110. In one embodiment, the measurements 317 may be configured for measuring one or more gas chemistries (e.g., volume, amounts, mixtures, etc.). In other embodiments, the measurements 317 may be configured for measuring other parameters, including temperature, pressure, etc.

In one embodiment, a feedback loop for a particular subsystem includes multiple steps that are implemented when transitioning between process steps. That is, the feedback loop determines whether performance of the control signals for the respective subsystem are performed. In particular, a feedback loop includes a first step of measuring a parameter that is controlled by the respective subsystem. For example, with regards to the RF generator(s) subsystem 104, a parameter may include one of amplitude, phase (induced time when applying the control signal), power, etc. For example, with regards to gas manifold(s) subsystem 112, a parameter may indicate whether a respective valve is open or closed. The feedback loop includes a second step of processing the measured parameter. The feedback loop includes a third step of determining a change based on the processed measurement. For example, if a desired level of a parameter is required in response to an initial control signal, and the desired level has not been achieved, then a feedback control signal may be generated to help the communications system 300 to achieve the appropriate level for the respective parameter. As such, the feedback control signal may be different than the initial control signal. The feedback loop includes a fourth step of applying the change. Application of the change may be performed by sending a corresponding control signal (e.g., feedback control signal) to the respective subsystem within one cycle of a clock speed of the master clock 260. That is, the feedback loop is performed within the one cycle period.

In one embodiment, the feedback loop comprises a proportional-integral-derivative (PID) control loop. For purposes of illustration only, a PID control loop implements one or more steps to provide feedback. The PID control loop may include reading a sensor (e.g., determining a measurement of a parameter), and then computing an output by calculating proportional, integral, and derivative responses to the sensor readings. The responses are accumulated to generate the output. The output may be used to determine an actuator response.

In one embodiment, the feedback control signal delivered to a first subsystem is based on control signals and/or measurements of at least one parameter controlled by a second subsystem. For example, the control signal may be an RF power control signal delivered to an RF generator as the first subsystem. In another example, the control signal is based on measurements of a first gas chemistry and a second gas chemistry within the plasma process module, wherein the first gas chemistry and the second gas chemistry are used when performing at least one of the process steps. In addition, the first gas and second gas chemistries are controlled by one or more gas supply manifold(s) as a second subsystem. In some embodiments, the control signal may be an initial control signal.

Figure 4A:
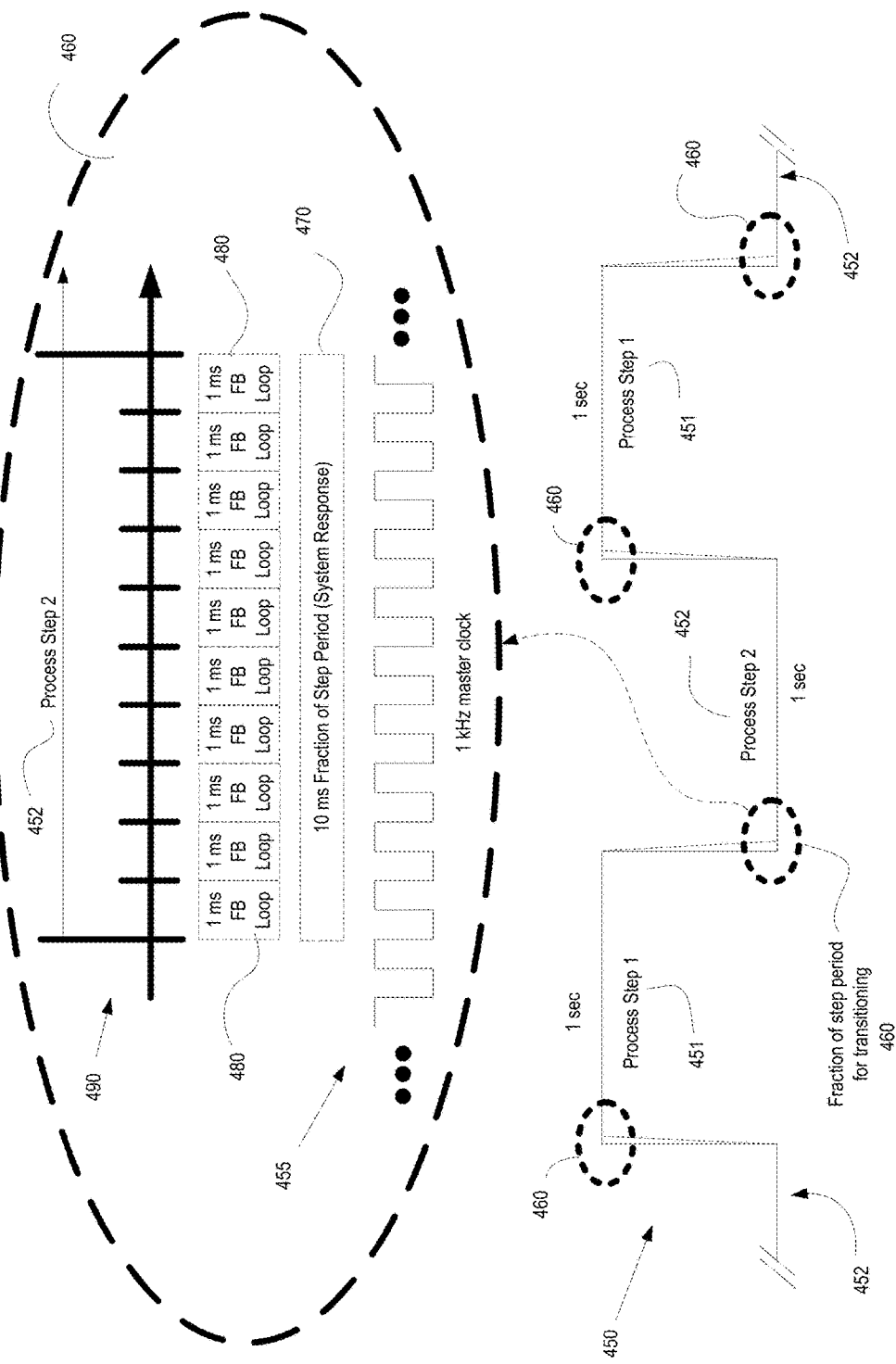
FIG. 4A illustrates one or more clock cycles of a master clock in a communications system configured for synchronizing control signals delivered to and received from subsystems of a plasma process module, wherein during a transition between process steps a feedback loop is performed within one clock cycle, the feedback loop including delivering and receiving synchronized control signals from a plurality of subsystems by a distributed clock module or distributed controller of the communications system of FIG. 4A, in accordance with one embodiment of the present disclosure.

FIG. 4A illustrates one or more clock cycles of a master clock in a communications system configured for synchronizing control signals delivered to and received from subsystems of a plasma process module, wherein during a transition between process steps, a feedback loop is performed within one clock cycle, the feedback loop including delivering and receiving synchronized control signals from a plurality of subsystems by a distributed clock module or distributed controller of the communications system of FIG. 4A, in accordance with one embodiment of the present disclosure. The feedback loops as shown in FIG. 4A performed when transitioning between process steps may be implemented within the communications systems 200A, 200B, and 300 of FIGS. 2A, 2B, and 3, in embodiments.

In particular, a plurality of process steps 450 are performed within a communication system. For example, the process steps 450 may include process step 1 (451) and process step 2 (452), wherein each of the process steps includes a step period. For illustration purposes only, an exemplary step period may be 1 second. Process step 1 (451) and process step 2 (452) may be repeated until the manufacturing process is completed. For example, process step 1 may be an activation step and process step 2 may be a deposition step, both of which are performed during a quasi-ALD process.

Transitions 460 to each of process step 1 (451) and process step 2 (452) are shown. Embodiments of the present disclosure provide for transitioning to a process step within a fraction of the step period, as previously introduced. As such, for each transition 460, the transition to process step 1 or process step 2 is achieved within the fraction of the step period, such that each of the subsystems of the communications system has achieved its respective response time. In one embodiment, the step period includes 100 fractions. In other embodiments, the step period includes more than 100 fractions, or less than 100 fractions. For a step period of 100 fractions, a single fraction is one-percent or less of the step period, such that the transition is achieved within one-percent of the step period, in one embodiment. By varying the number of fractions in a step period, other percentages may be achieved for performing the transition between process steps. In one embodiment, the fraction is five-percent or less of the step period. In other embodiments, the fraction is ten-percent or less of the step period. In other embodiments, control is achieved by varying the step period.

A detailed illustration of one of the transitions 460 to process step 2 (452) is shown in FIG. 4A. In particular, the predefined number of clock cycles is determined based on control requirements. For example, the control requirements may include 10 feedback loops to be performed within the fraction 470 of a step period, wherein the step period includes 100 fractions. In other examples, the control requirements may include a lesser number of feedback loops (e.g., 6), or a greater number of feedback loops. As shown in FIG. 4A, ten feedback loops 480 are required to be performed within the fraction 470 of the step period of process step 2. In particular, fraction 470 of process step 2 is of a duration of 10 ms, or one percent of the step period of one second. Fraction 470 is shown in comparison to time line 490, wherein time line 490 in FIG. 4A shows the initiation of process step 2 (452), and the 10 feedback loops 480 performed during the transition.

Because each clock cycle has a duration that is pre-correlated to a feedback loop, and the time period of the fraction of the step period is known, the clock speed of the master clock 455 is known. As shown in FIG. 4A, a feedback loop is pre-correlated to a clock cycle, and the feedback loop is of 1 ms duration (e.g., 10 feedback loops within a fraction 470 of 10 ms of a step period of one second). With a clock cycle of 1 ms, the clock speed is 1 kHz (one thousand cycles per second).

Figure 4B:
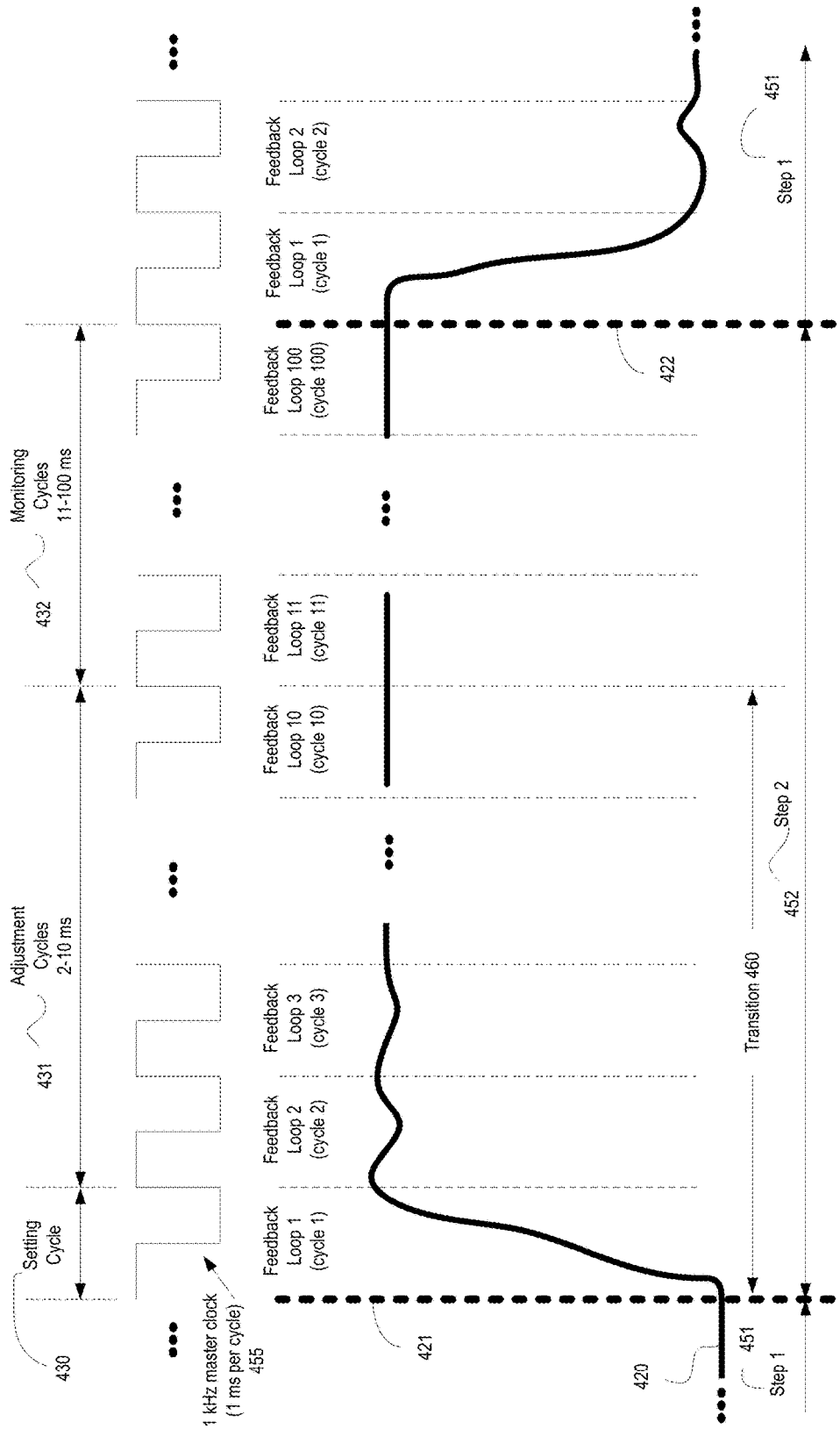
FIG. 4B illustrates a process step aligned with clock cycles of a master clock in a communications system configured for synchronizing control signals delivered to and received from subsystems of a plasma process module, wherein during a transition between process steps a corresponding number of feedback loops are performed during a predetermined number of clock cycles, in accordance with one embodiment of the present disclosure.
Figure 5:
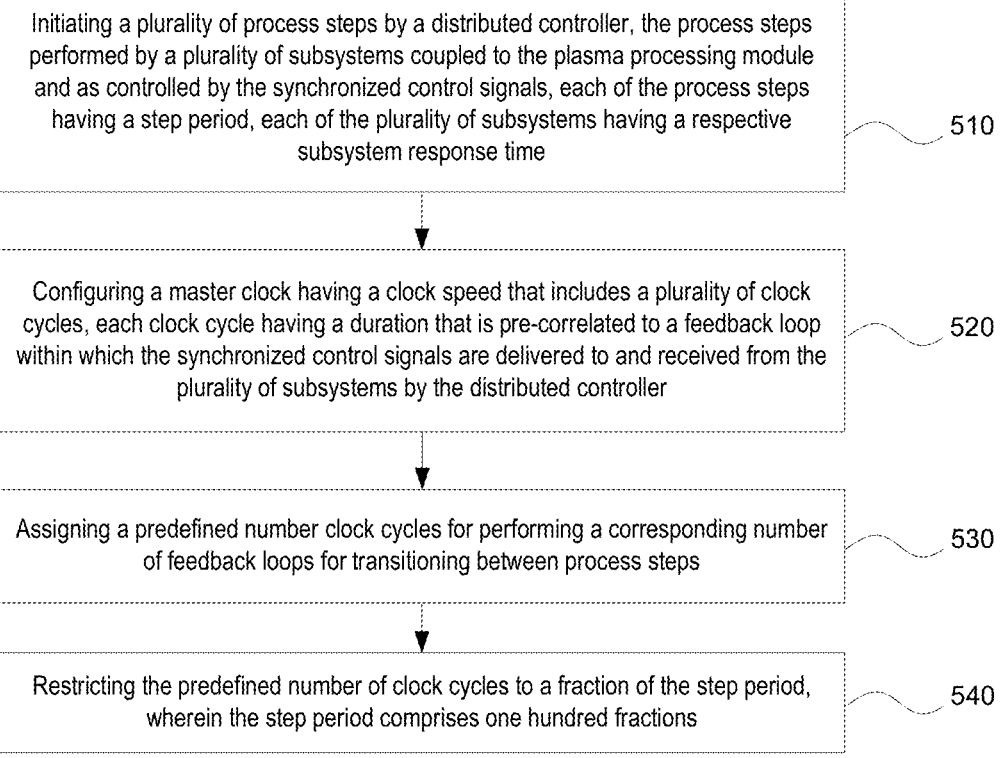
FIG. 5 is a flow diagram illustrating a method for synchronizing control signals delivered to and received from subsystems of a plasma process module, in accordance with one embodiment of the present disclosure.

FIG. 4B is another illustration of the transition 460 between process steps introduced in FIG. 4A as shown with respect to the application of RF power indicated by an RF power signal 420, wherein the RF power signal (e.g., parameter) is controlled by an RF generator(s) subsystem, in accordance with one embodiment of the present disclosure. Process step 2 (452 is shown and located after a first process step 1 (451) and before a second process step 1.

Process step 2 (452) is aligned with clock cycles of a master clock found in a communications system configured for synchronizing control signals delivered to and received from subsystems of a plasma process module. The process step 2 has a step period of 1 second. Because the step period has 100 fractions, there are one hundred fractions, each fraction having a duration of 10 ms.

In addition, during a transition 460 between process steps (e.g., transitioning to process step 2) a corresponding number of feedback loops are performed during a predetermined number of clock cycles. Also, the predetermined number of clock cycles are restricted to the fraction of the step period. As such, for a corresponding number of feedback loops and a predetermined number of clock cycles both equaling 10, a feedback loop is performed within a clock cycle of 1 ms of a master clock 455.

Process step 2 may be defined as having 100 feedback loops that are performed during the step period (e.g., 1 second). The process step 2 may include a setting feedback loop or cycle 430 that is performed within a first clock cycle (e.g., feedback loop or cycle 1) of the master clock 455, or the first millisecond of the transition 460. The setting feedback loop is configured for setting one or more control parameters of the plurality of subsystems. For example, the setting feedback loop may be used to set the RF power (e.g., amplitude) of an RF generator(s) subsystem.

Because the control of the respective subsystem or subsystems may not be achieved within one clock cycle, multiple clock cycles are assigned to the transition period that occurs during the fraction of the step period. As such, in addition to the setting feedback loop 430, process step 2 may include a plurality of adjusting feedback loops 431 to perform feedback controlled tuning of the respective subsystem. Each adjusting feedback loop is performed within another one clock cycle of the master clock, wherein the adjusting feedback loops are performed after the setting feedback loop 430. As shown, adjusting feedback loops 431 include feedback loops or cycles 2-10 that are performed between the second the tenth milliseconds of the transition 460. In addition, each adjusting feedback loop 431 is configured for verifying the setting of the one or more control parameters and/or for adjusting the setting of the one or more control parameters. By the end of the transition 460, the required and corresponding number of feedback loops have been performed, after which the transition to process step 2 for each of the respective subsystems is completed and achieved.

Further, a plurality of monitoring feedback loops 432 may be performed after the plurality of adjusting feedback loops within the step period. As shown, monitoring feedback loops 432 include feedback loops or cycles 11-100 that are performed between the eleventh and one-hundredth milliseconds of the step period. Each monitoring feedback loop 431 is configured for verifying the setting of the one or more control parameters. Further adjustments to the settings may be made during the monitoring feedback loops 431, if necessary.

In addition, because precise phase and synchronization control of the subsystems coupled to a process module is achieved through a master clock, plasma processing may be controlled over shorter step times (e.g., sub-one-second step periods) to greater process capabilities, such as when implementing complex recipe tuning algorithms for quasi-ALD and quasi-ALE processes. For example, additional or recipe sub-steps may be included within the overall step period during one or more monitoring feedback loops 432. In one embodiment, control of a sub-step may be performed within a transition period of a fraction of the overall step period to achieve uniformity and repeatability between similarly performed process steps.

With the detailed description of the various modules of the communications systems 200A, 200B, and 300, flow diagram 500 discloses a method for synchronizing control signals between subsystems of a plasma process module, in accordance with one embodiment of the present disclosure. In embodiments, flow diagram 500 is implemented within the above referenced communications systems.

At 510, the method includes initiating a plurality of process steps by a distributed controller. The process steps are performed by a plurality of subsystems coupled to the process module, wherein each of the process steps has a step period. The subsystems are controlled by synchronized control signals, wherein the control signals are synchronized and delivered to the subsystems by a stand-alone distributed controller, or by a distributed clock module that receives the control signals initially from a separate distributed controller. Each of the subsystems has a respective subsystem response time, within which control of a corresponding subsystem is achieved during a transition to a process step.

In one embodiment, the method performed in flow diagram 500 is implemented to perform a deposition process with atomic layer precision without self-limiting reactions in the plurality of process steps, the process steps including an activation step, and a deposition step, such as in a quasi-ALD process. In another embodiment, the method performed in flow diagram 500 is implemented to perform an etching process with atomic layer precision without self-limiting reactions in the plurality of process steps, the process steps including an activation step, and an etching step.

At 520, the method includes configuring a master clock having a clock speed that includes a plurality of clock cycles. The master clock is used for synchronizing control signals, and as such is located in the stand-alone distributed controller or the distributed clock module. Each clock cycle of the master clock has a duration that is pre-correlated to a feedback loop. The synchronized control signals are delivered to and received from the plurality of subsystems by the distributed controller within the feedback loop and clock cycle.

At 530, the method includes assigning a predefined number of clock cycles for performing a corresponding number of feedback loops for transitioning between process steps. Further, one feedback loop is defined to be performed within one clock cycle of the master clock. As previously described, performing a feedback loop includes measuring a parameter controlled by the respective subsystem, processing the measured parameter, determining a change based on the processed measurement, and applying the change by sending a corresponding control signal to the respective subsystem within one cycle of a clock speed of the master clock. In one embodiment, the feedback loop includes steps performed in a PID loop.

In addition, at 540, the method includes restricting the predefined number of clock cycles to a fraction of the step period, wherein the step period comprises one hundred fractions. That is, the fraction of the step period defines the transition period within which control signals to each of the subsystems is achieved during a transition to a corresponding process step. In one embodiment, the fraction is one percent or less of the step period. In another embodiment, the fraction is five percent or less of the step period. In still another embodiment, the fraction is 10 percent or less of the step period.

Further, once the fraction of the step period, the predefined number of clock cycles, and the corresponding number of feedback loops are determined, the clock speed of the master clock can be determined. Also, the number of clock cycles may be determined for the step period. As such, when performing the corresponding number of feedback loops for transitioning between process steps, the method includes performing a setting feedback loop, wherein the setting feedback loop is performed within a first clock cycle of the master clock. The setting feedback loop configured for setting one or more control parameters of the plurality of subsystems. In addition, the method includes performing a plurality of adjusting feedback loops. Each of the adjusting feedback loops is performed within another clock cycle of the master clock and is performed after the setting feedback loop. Each adjusting feedback loop is configured for verifying the setting of the one or more control parameters and for adjusting the setting of the one or more control parameters, as previously described.

In one embodiment, the method includes generating a control signal delivered to a first subsystem based on measurements of at least one parameter controlled by a second subsystem. The control signal may be a feedback control signal or an initial control signal used when transitioning to a process step. For example, the control signal may be an RF power control signal delivered to an RF generator as the first subsystem. In particular, the control signal is based on measurements of a first gas chemistry and a second gas chemistry within the plasma process module, wherein the first gas chemistry and the second gas chemistry are used when performing at least one of the process steps. In addition, the first gas and second gas chemistries are controlled by one or more gas supply manifold(s) as a second subsystem. In some embodiments, the control signal may be an initial control signal.

FIGS. 6A-6F illustrate the ability to synchronize the control of RF power and gas delivery with high resolution in a communications system configured for synchronizing control signals delivered to and received from subsystems of a plasma process module, in accordance with embodiments of the present disclosure. In each of the FIGS. 6A-6E, line 610 shows the step boundary, and indicates the point where the gas chemistry changes from a first chemistry to a second chemistry, such as when changing from a first recipe step (first process step) to a second recipe step (second process step). That is, the first recipe step is to the left of line 610, and the second recipe step is to the right of line 610. In each of the graphs of FIGS. 6A-6E, the transition between the first recipe step to the second recipe step is highlighted with reference to a timeline along their respective x-axis showing tenths of a second increments. The y-axis shows the emission intensity of a related gas chemistry.

FIG. 6A shows a graph 600A showing the relationship between gas chemistries and the application of RF power with a 0 ms phase delay, in accordance with one embodiment of the present disclosure. For example, line 630 shows the measurement of the first gas chemistry as it moves from a high concentration to a low concentration within a corresponding process module. In one implementation, line 630 indicates a measured emission intensity of the first gas chemistry. As the concentration of the first gas chemistry is reduced, the resulting emission intensity of line 630 will also be lowered.

The application of the proper RF power has an effect on the emission intensity of the first gas chemistry. Line 635 indicates the change in the application of RF power. In FIG. 6A, the RF power has no phase delay. In particular, line 610 indicates the point where the RF power is changed. That is, where line 635 intersects line 610 (0 phase delay), a change of the RF power is also initiated (e.g., from a first level to a second level). In one implementation, the change of RF power goes from low to high, or from high to low. Control of the gas and RF power is possible because of the reduction in jitter realized when synchronizing control signals using the master clock having a sufficient and required speed that is tied to one or more feedback loops. As shown, the emission intensity of the first gas chemistry is lowered with the change in the RF power level, and settles to a minimum concentration after 1 to 3 ms after the application of RF power.

FIG. 6B illustrates a graph 600B showing the relationship between gas chemistries and the application of RF power with a 50 ms phase delay, in accordance with one embodiment of the present disclosure. For example, line 640 shows the measurement of the first gas chemistry as it moves from a high concentration to a low concentration within a corresponding process module. In one implementation, line 640 indicates a measured emission intensity of the first gas chemistry. As the concentration of the first gas chemistry is reduced, the resulting emission intensity of line 640 will also be lowered.

The application of the proper RF power has an effect on the emission intensity. Line 645 indicates the change in the application of RF power. In graph 600B, the RF power has a 50 ms phase delay. In particular, line 612 indicates the point where the RF power is changed. That is, where line 645 intersects line 612 (50 ms phase delay), a change of the RF power is also initiated (e.g., from a first level to a second level). In one implementation, the change of RF power goes from low to high, or from high to low. Control of the gas and RF power is possible because of the reduction in jitter realized when synchronizing control signals using the master clock having a sufficient and required speed that is tied to one or more feedback loops. As shown, the emission intensity of the first gas chemistry is lowered with the change in the RF power level, and settles to a minimum concentration after 1 to 3 ms after the application of RF power at line 612.

FIG. 6C illustrates a graph 600C showing the relationship between gas chemistries and the application of RF power with a 100 ms phase delay, in accordance with one embodiment of the present disclosure. For example, line 650 shows the measurement of the first gas chemistry as it moves from a high concentration to a low concentration within a corresponding process module. In one implementation, line 650 indicates a measured emission intensity of the first gas chemistry. As the concentration of the first gas chemistry is reduced, the resulting emission intensity of line 650 will also be lowered.

The application of the proper RF power has an effect on the emission intensity of the first gas chemistry. Line 655 indicates the change in the application of RF power. In graph 600C, the RF power has a 100 ms phase delay. In particular, line 614 indicates the point where the RF power is changed. That is, where line 655 intersects line 614 (100 ms phase delay), a change of the RF power is also initiated (e.g., from a first level to a second level). In one implementation, the change of RF power goes from low to high, or from high to low. Control of the gas and RF power is possible because of the reduction in jitter realized when synchronizing control signals using the master clock having a sufficient and required speed that is tied to one or more feedback loops. As shown, the emission intensity of the first gas chemistry is lowered with the change in the RF power level, and settles to a minimum concentration after 1 to 3 ms after the application of RF power at line 614.

FIG. 6D illustrates a graph 600D showing the relationship between gas chemistries and the application of RF power with a 200 ms phase delay, in accordance with one embodiment of the present disclosure. For example, line 660 shows the measurement of the first gas chemistry as it moves from a high concentration to a low concentration within a corresponding plasma process module. In one implementation, line 660 indicates a measured emission intensity of the first gas chemistry. As the concentration of the first gas chemistry is reduced, the resulting emission intensity of line 660 will also be lowered.

The application of the proper RF power has an effect on the emission intensity of the first gas chemistry. Line 665 indicates the change in the application of RF power. In graph 600D, the RF power has a 200 ms phase delay. In particular, line 616 indicates the point where the RF power is changed. That is, where line 665 intersects line 616 (200 ms phase delay), a change of the RF power is also initiated (e.g., from a first level to a second level). In one implementation, the change of RF power goes from low to high, or from high to low. Control of the gas and RF power is possible because of the reduction in jitter realized when synchronizing control signals using the master clock having a sufficient and required speed that is tied to one or more feedback loops. As shown, the emission intensity of the first gas chemistry is lowered with the change in the RF power level, and settles to a minimum concentration after 1 to 3 ms after the application of RF power at line 616.

FIG. 6E illustrates a graph 600E showing the relationship between gas chemistries and the application of RF power with a 400 ms phase delay, in accordance with one embodiment of the present disclosure. For example, line 670 shows the measurement of the first gas chemistry as it moves from a high concentration to a low concentration within a corresponding process module. In one implementation, line 670 indicates a measured emission intensity of the first gas chemistry. As the concentration of the first gas chemistry is reduced, the resulting emission intensity of line 670 will also be lowered.

The application of the proper RF power has an effect on the emission intensity of the first gas chemistry. Line 675 indicates the change in the application of RF power. In graph 600E, the RF power has a 400 ms phase delay. In particular, line 618 indicates the point where the RF power is changed. That is, where line 675 intersects line 618 (400 ms phase delay), a change of the RF power is also initiated (e.g., from a first level to a second level). In one implementation, the change of RF power goes from low to high, or from high to low. Control of the gas and RF power is possible because of the reduction in jitter realized when synchronizing control signals using the master clock having a sufficient and required speed that is tied to one or more feedback loops. As shown, the emission intensity of the first gas chemistry is lowered with the change in the RF power level, and settles to a minimum concentration after 1 to 3 ms after the application of RF power at line 618.

FIG. 6F illustrates a graph 600F showing the relationship between gas chemistries and the application of RF power with an 800 ms phase delay, in accordance with one embodiment of the present disclosure. For example, line 680 shows the measurement of the first gas chemistry as it moves from a high concentration to a low concentration within a corresponding process module. In one implementation, line 680 indicates a measured emission intensity of the first gas chemistry. As the concentration of the first gas chemistry is reduced, the resulting emission intensity of line 680 will also be lowered.

The application of the proper RF power has an effect on the emission intensity of the first gas chemistry. Line 685 indicates the change in the application of RF power. In graph 600F, the RF power has an 800 ms phase delay. In particular, line 620 indicates the point where the RF power is changed. That is, where line 685 intersects line 620 (800 ms phase delay), a change of the RF power is also initiated (e.g., from a first level to a second level). In one implementation, the change of RF power goes from low to high, or from high to low. Control of the gas and RF power is possible because of the reduction in jitter realized when synchronizing control signals using the master clock having a sufficient and required speed that is tied to one or more feedback loops. As shown, the emission intensity of the first gas chemistry is lowered with the change in the RF power level, and settles to a minimum concentration after 1 to 3 ms after the application of RF power at line 620.

Figure 7A:
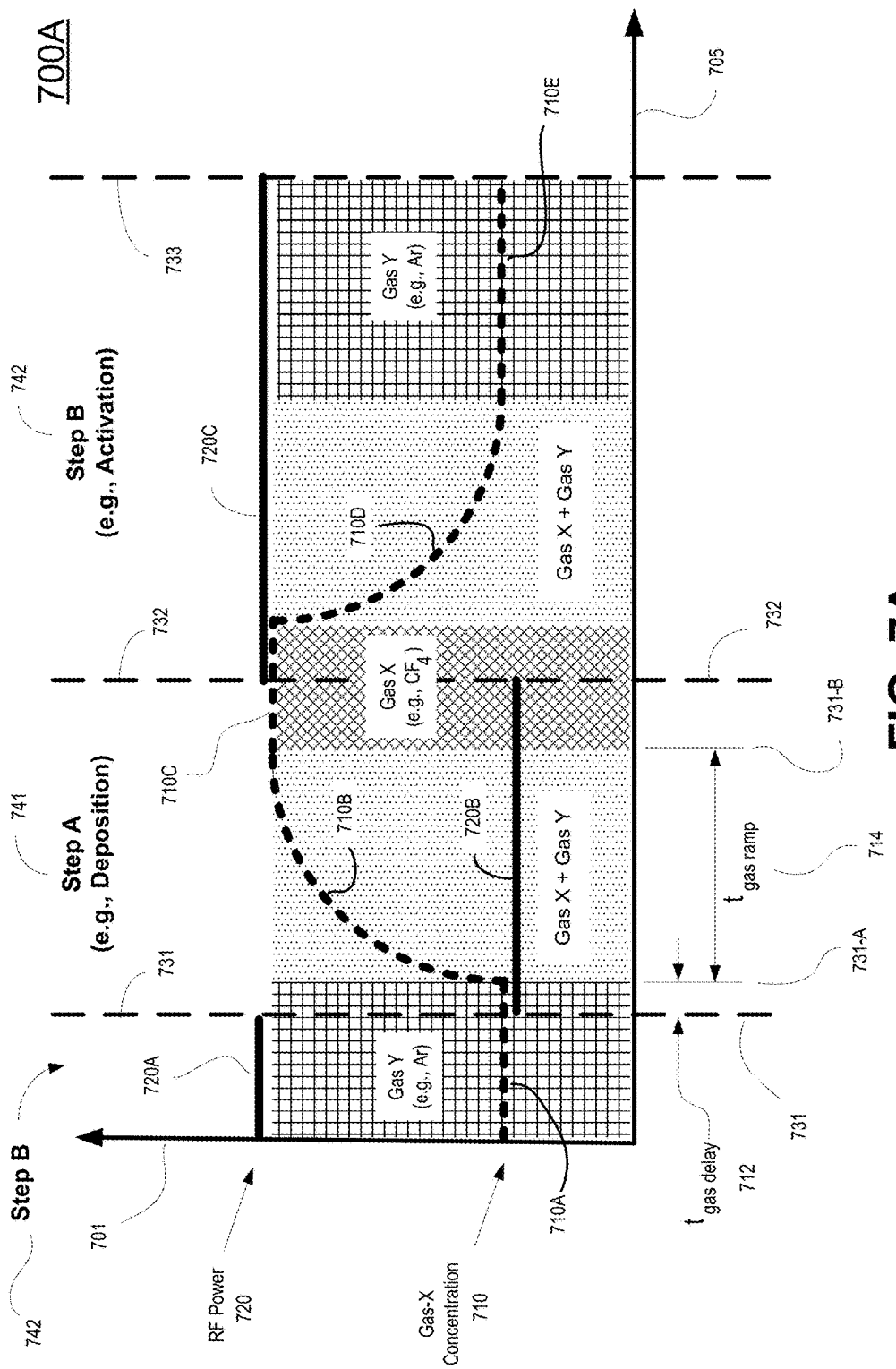
FIG. 7A illustrates the application of two levels of RF power and gas delivery with low resolution in a communications system for delivering control signals to subsystems of a plasma process module.

FIG. 7A is a plot 700A that illustrates the application of two levels of RF power and gas delivery with low resolution in a communications system for delivering control signals to subsystems of a process module. The control signals for subsystems (e.g., RF generator(s) and gas supply manifold (s), etc.) are not synchronized in plot 700A, as plot 700A illustrates the application of RF power and gas delivery without any feedback/active-feedback controls. In plot 700A, y-axis 701 indicates RF power, and the x-axis 705 indicates time. Step boundary line 731 indicates the transition between a generic process step, labeled Step B 742, to a second process step, labeled Step A 741. Purely for illustration, Step B 742 could be an activation step, and Step A 741 could be a deposition step. Step boundary line 732 indicates the transition between the generic process step, labeled Step A 741, to the other process step, labeled Step B 742. Step boundary line 733 indicates the transition between the one generic process step, labeled Step B 742 to another generic process step (not shown, such as step A 741). The process Step A 741 and process Step B 742 (e.g., activation and boundary steps) are repeatable. Line 720 indicates RF power intensity, and is applied at a high level and a lower level in respective process steps, as will be described below. Line 720 is broken into segments (e.g., 720A-720C). Because no master clock is employed to synchronize and provide 1 ms feedback of control signals, there are large latency and jitter effects associated with the communication subsystems. Line 710 indicates a concentration of a gas chemistry X. For example, in the case where Step A 741 is a deposition step, gas chemistry X could be tetrafluoromethane ($CF_4$). Line 710 is broken into segments (e.g., 710A-710E).

To the left of boundary step line 731 process Step B 742 is performed in the process module. The RF power is applied at a high level, as indicated by line segment 720A. The concentration of gas within the process module is primarily gas chemistry Y. For example, in the case where Step B 742 is an activation step, gas chemistry Y could be argon (Ar). That is, the concentration of gas chemistry X is low as indicated by line segment 710A.

Process Step A 741 (e.g., deposition) is initiated at boundary step line 731, wherein a change in gas chemistries is implemented (e.g., introduction of gas chemistry X). The RF power is applied at a low level, as indicated by line segment 720B throughout the process Step A 741 even though the gas chemistries may not be optimum throughout the process module. A delay in the change in the introduction of the new gas is indicated by delay period (t-gas delay 712). The new gas chemistry X (e.g., $CF_4$) ramps up to a high concentration over the gas ramp time (t-gas ramp 714), as indicated in the line segment 710B, indicating a mixture of gasses (gas chemistry X and gas chemistry Y). The gas chemistry X reaches its maximum concentration in line segment 710C while still undergoing process Step A 741 in the process module.

Process Step B 742 (e.g., activation) is initiated at boundary step line 732, wherein a change in gas chemistries is again implemented (e.g., introduction of gas chemistry Y). The RF power is applied at a high level as indicated by line segment 720C throughout the process step B 742, even though the gas chemistries may not be optimum within the process module. The new gas chemistry Y (e.g., argon) ramps to a high concentration in the process module, which is indicated by a reduction in the concentration of gas chemistry X, as indicated by the gradual reduction in value over dotted line segment 710D, indicating a mixture of gasses (gas chemistry X and gas chemistry Y). The gas chemistry Y reaches its maximum concentration in line segment 710E while still undergoing the process Step B 742 in the process module.

Figure 7B:
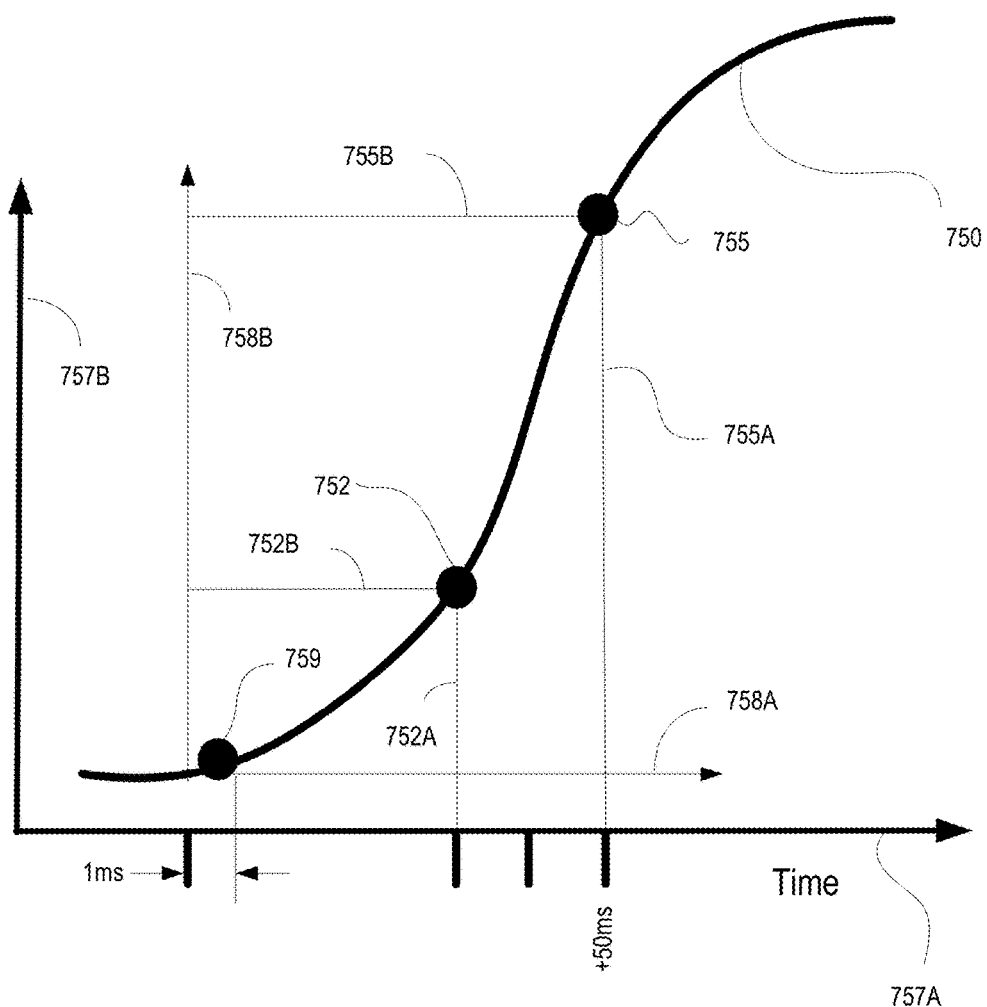
FIG. 7B illustrates the effect of latency and delay periods about a desired gas mixture in a communications system controlling subsystems of a plasma process module, in accordance with one embodiment of the present disclosure.

FIG. 7B is a plot 700B that illustrates the effects of latency and delay periods about a desired gas mixture in a communications system controlling subsystems of a plasma process module, in accordance with one embodiment of the present disclosure. Embodiments of the present disclosure are able to reduce the effects of latency and delay in a communications system configured for synchronizing control signals delivered to and received from subsystems of a process module. In that case, the application of RF power ideally could be performed repeatedly at point 759, which indicates a desired concentration of one or more gasses. Plot 700B includes a y-axis 757B showing the concentration of a gas chemistry X, and an x-axis 757A showing time.

Line 750 indicates a concentration of a gas chemistry X during the transition to a process step (e.g., activation or deposition). Line 758B indicates the step boundary between process steps. The concentration of gas chemistry X at point 759 is desired for the application of a corresponding RF power. That is the desired ratio of chemistries (e.g., gas X to gas Y). To achieve high repeatability and therefore uniformity between implementations of the same process step, latency and jitter must be reduced, so that the corresponding RF power can be applied at point 759 (e.g., 1 ms latency with a +/−1 ms jitter).

Without the distributed controller of embodiments of the present disclosure, jitter and latency are introduced. That is, the application of RF power may occur before or after point 759. For example, point 755 indicates a 50 ms delay in the application of RF power off the desired concentration of gas at point 759, wherein the delay is due to jitter and/or latency. At point 755, the ratio of chemistries (e.g., gas X to gas Y) may be given by the ratios of two areas (e.g., 1—the area above line 750 and bounded by lines 758B and 755B, and 2—the area below line 750 and bounded by lines 758A and 755A. This ratio may not be ideal, as line 750 is experiencing an exponential increase about point 751, and especially between points 752 and 755, such that the ratio would vary greatly between these points.

Figure 7C:
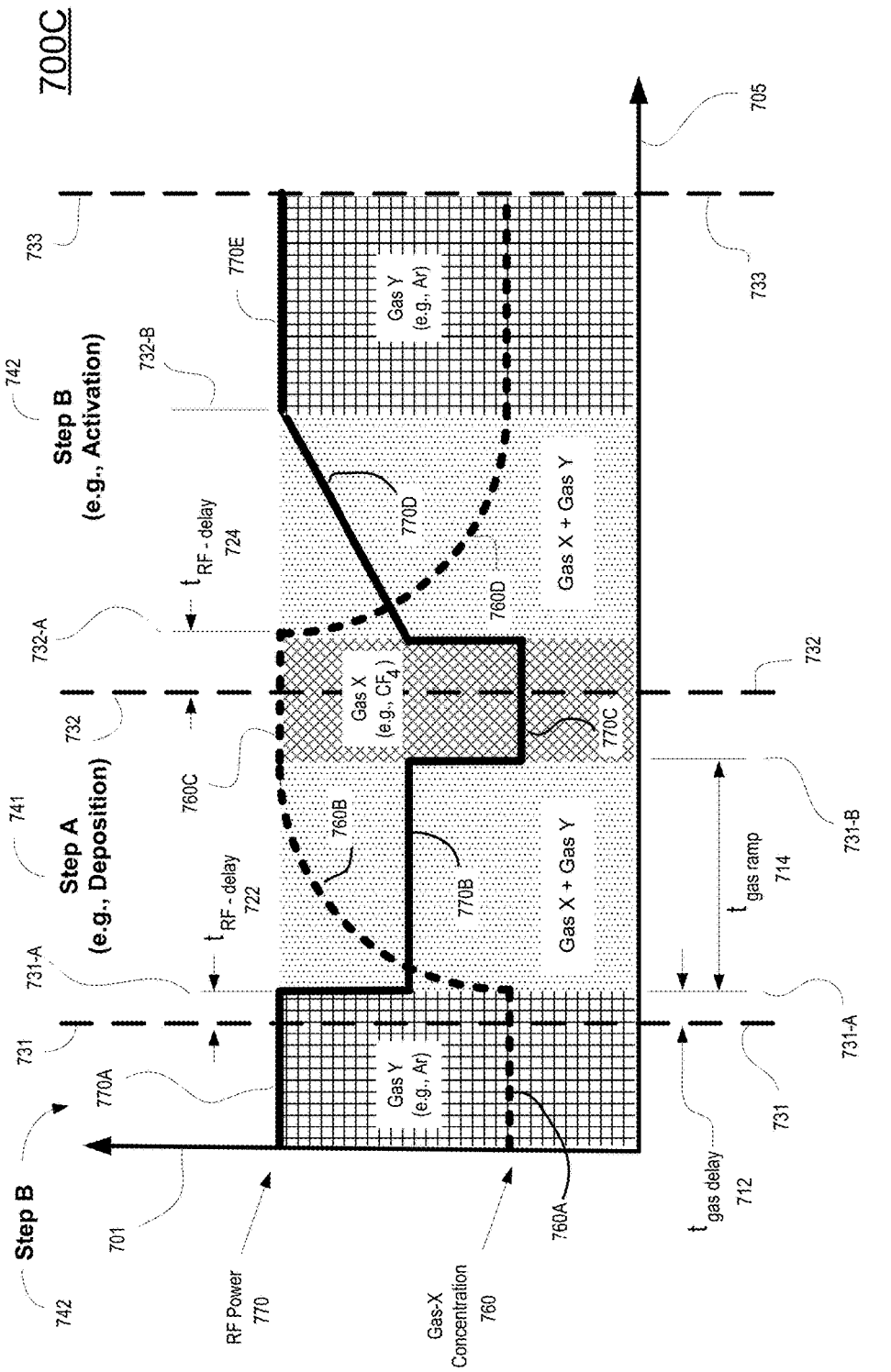
FIG. 7C illustrates the application of RF power and gas delivery in a communications system configured for synchronizing control signals delivered to and received from subsystems of a plasma process module, wherein the RF power as controlled by a first subsystem may be applied in consideration of gas chemistry ratios as controlled by a second subsystem, and wherein the control signals are synchronized using a master clock having a clock cycle within which a feedback loop is performed thereby allowing for linear and non-linear application of RF power, in accordance with one embodiment of the present disclosure.

Embodiments of the present invention provide feedback/active-feedback controls on any sub-system that is attached to a distributed controller. For example, one sub-system is configured to provide RF power and/or gas delivery. As an illustration of providing feedback/active-feedback on a subsystem, FIG. 7C is a plot 700C that illustrates the application of RF power and gas delivery in a communications system configured for synchronizing control signals delivered to and received from subsystems of a plasma process module, wherein the RF power as controlled by a first subsystem may be applied in consideration of gas chemistry ratios as controlled by a second subsystem, and wherein the control signals are synchronized using a master clock having a clock cycle within which a feedback loop is performed thereby allowing for linear and non-linear (i.e., arbitrary functional form) application of RF power, in accordance with one embodiment of the present disclosure. In particular, the control signals for subsystems (e.g., RF generator(s) and gas supply manifold(s), etc.) are synchronized in plot 700C using the previously introduced master clock. In plot 700C, y-axis 701 indicates RF power, and the x-axis 705 indicates time. Step boundary line 731 indicates the transition between a generic process step, labeled Step B 742, to a second process step, labeled Step A 741. Purely for illustration, Step B 742 could be an activation step and Step A 741 could be a deposition step. Step boundary line 732 indicates the transition between the generic process Step A 741 to the other generic process Step B 742. Step boundary line 733 indicates the transition between process Step B 742 to process step A 741 (not shown). The process Step A 741 and process Step B 742 (e.g., activation and boundary steps) are repeatable.

As shown in plot 700C, the communications system is configured to measure the gas delay time (t-gas delay) and gas ramp time (t-gas ramp) in real-time, and determine a threshold chemistry ratio (e.g., between two gas chemistries). Based on the previous information, the communications system is configured to adjust the phase delay and amplitude of the application of RF power (RF-hold) and adjust the application of RF ramp times during process Step B 742, such as when applying RF power during line segments 770C, 770D, and 770E. The same or similar process may be used to determine phase delay and amplitude of the application of RF power during process Step A 741.

Line 770 indicates RF power intensity, and is applied at various levels between a high level and a low level in repetitive process steps. That is, RF power intensity may be modulated or changed according to a process model throughout a process step because of the precise phase and synchronization control of subsystems coupled to a process module, such as when implementing quasi-ALD and quasi-ALE processes. Line 770 is broken into segments (e.g., 770A-770E). Because of the use of a master clock and/or distributed controller to synchronize and provide 1 ms feedback of control signals, latency and jitter effects associated with the communication subsystem are reduced.

Line 760 indicates a concentration of a gas chemistry X. For example, in the case where Step A 741 is a deposition step, gas chemistry X could be tetrafluoromethane ($CF_4$). Line 760 is broken into segments (e.g., 760A-760D). Though not necessarily shown, the gas concentrations may be modulated or changed according to a process model throughout a process step because of the precise phase and synchronization control of subsystems coupled to a process module, such as when implementing quasi-ALD and quasi-ALE processes, as will be described below in FIG. 8.

To the left of boundary step line 731, process Step B 742 is performed in the process module. The RF power is applied at a high level, as indicated by line segment 770A. The concentration of gas chemistry Y is at its highest level just to the left of line 731 within the process module. For example, in the case where Step B 742 is an activation step, gas chemistry Y could be argon (Ar). That is, the concentration of gas chemistry X is low as indicated by line segment 760A.

Process Step A (e.g., deposition) is initiated at boundary step line 731, wherein a change in gas chemistries is implemented (e.g., introduction of gas chemistry X). A delay in the change in the introduction of the new gas is indicated by delay period (t-gas delay 712) between lines 731 and 731-A. The new gas chemistry X (e.g., $CF_4$) ramps up to a high concentration over the gas ramp time (t-gas ramp 714), as indicated in the line segment 710B between lines 731-A and 731-B, indicating a mixture of gasses (gas chemistry X and gas chemistry Y). The gas chemistry X reaches it maximum concentration in line segment 760C at line 731B while still undergoing process Step A 741 in the process module.

The application of RF power may be matched to the gas concentration(s) within the process module. That is, as the gas mixture changes within line segment 760B, the RF power may be applied to match the gas mixture (e.g., linear or non-linear application of RF power). For simplicity of the figure, the RF power is applied at a medium level during the gas ramp time 714, as indicated by line segment 770B, but can take any functional form. In particular, line segment 770B begins at line 731-A, after a RF time or phase delay (t-RF delay 722) between lines 731 and 731-A. That is, the application of RF power is matched to the beginning of the gas ramp time 714. In this manner, the RF power may be applied at the appropriate level to match the gas chemistries found in the process module.

Further, line 731-B indicates the end of the gas ramp time 714, wherein the gas chemistry X (e.g., $CF_4$) reaches it maximum concentration in line segment 760C. During process Step A (e.g., deposition), the RF power may be further modulated to match the gas chemistries found in the process module. That is, the RF power is applied at its lowest level, as indicated by line segment 770C, while the concentration of the gas chemistry X remains at its highest.

As stated, process Step B 742 (e.g., activation) is initiated at boundary step line 732, wherein a change in gas chemistries is again implemented (e.g., introduction of gas chemistry Y). The RF power level (low) is maintained slightly through process Step B 742 in line segment 770C beyond step boundary 732 to line 732-A because the gas chemistry X remains at a high concentration due to a delay in the change of gas chemistries, as indicated by line segment 760C extending beyond line 732. That is, the RF power may be modulated throughout each of the process steps according to a process model.

The new gas chemistry Y (e.g., argon) ramps to a high concentration in the process module, as indicated by a reduction in the concentration of gas chemistry X, as indicated by the gradual reduction in value over line segment 760D indicating a mixture of gasses (gas chemistry X and gas chemistry Y).

The application of RF power may be matched to the gas concentration(s) within the process module. That is, as the gas mixture changes within line segment 760D, the RF power may be applied to match the gas mixture (e.g., linear or non-linear application of RF power). RF power can be applied to the process step (e.g., Step A and/or Step B) with a well-defined ramp (such as where defined means fas, repeatable turning off and on of the RF power), feedback value based off of an input parameter from a previous step, or actively provided feedback based on an input parameter read back every clock cycle from a subsystem sensor, for example in one embodiment. As shown, the RF power is applied as a ramp of increasing RF power, as indicated by line segment 770D. In particular, line segment 770D begins at line 732-A, after a RF time or phase delay (t-RF delay 724) between lines 732 and 732-A. That is, the application of RF power is matched to the change in gas chemistries, as indicated line 732-A. In this manner, the RF power may be applied at the appropriate level to match the gas chemistries found in the process module.

The gas chemistry Y reaches its maximum concentration in line segment 760E at the end of the gas ramp at line 732-B while still undergoing process Step B 742 in the process module. The RF power is applied at its highest level as indicated by line segment 770E to match the concentration of gasses in the process module (e.g., high concentration of argon).

Figure 8:
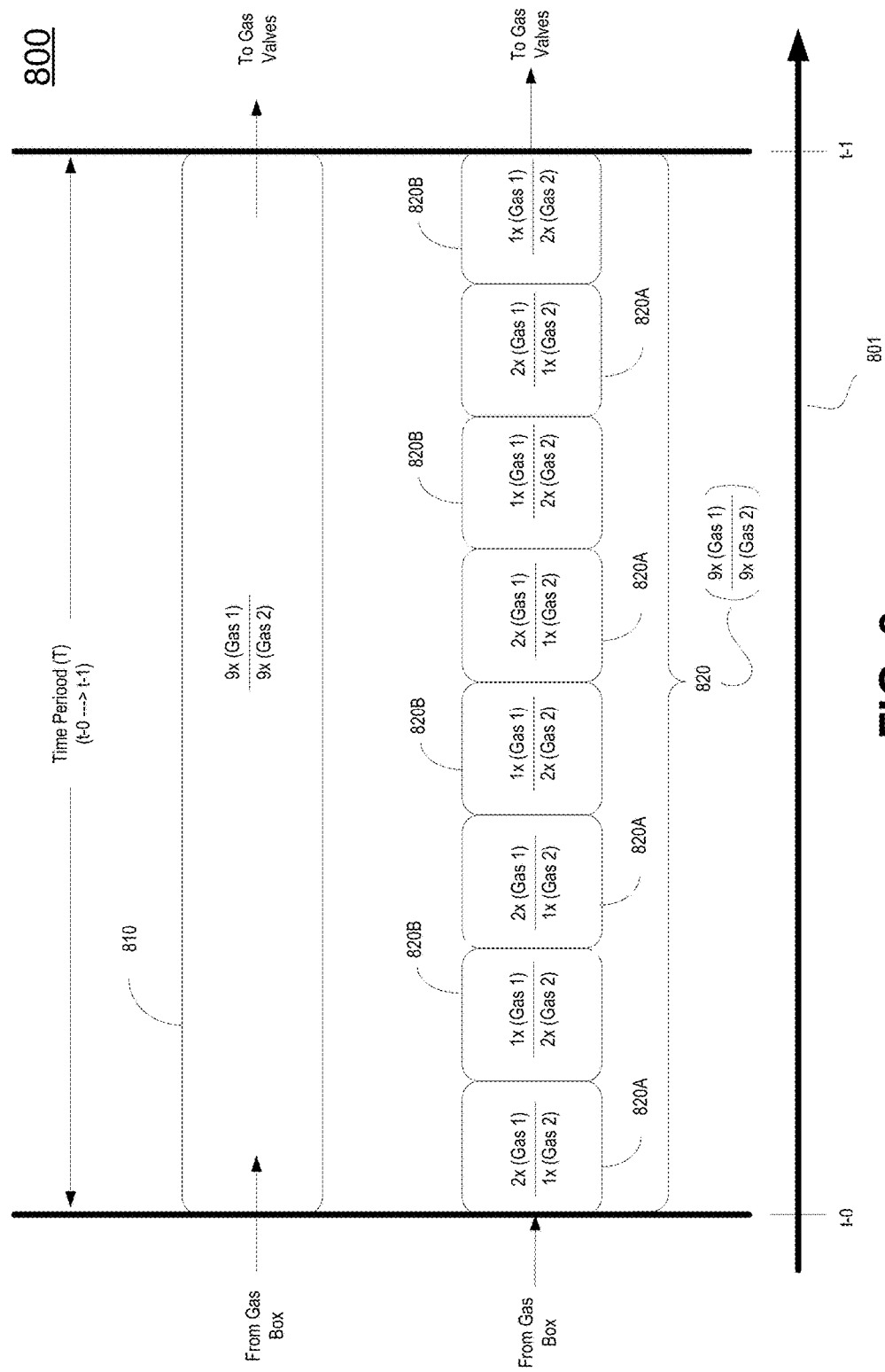
FIG. 8 illustrates the application of different gas chemistry ratios during a time period, wherein the gas chemistries are controlled within a communications system configured for synchronizing control signals delivered to and received from subsystems of a plasma process module, in accordance with one embodiment of the present disclosure.

FIG. 8 is a graph 800 that illustrates the application of different gas chemistry ratios during a time period, wherein the gas chemistries are controlled within a communications system configured for synchronizing control signals delivered to and received from subsystems of a plasma process module, in accordance with one embodiment of the present disclosure. Graph 800C shows a period of time (T) between t-0 and t-1 with reference to an x-axis 801 of time. Because embodiments of the present disclosure are capable of performing precise phase and synchronization control of subsystems coupled to a process module, this enables short step times (e.g., sub-one-second) that enable greater process capabilities, such as when implementing complex recipe tuning algorithms (e.g., RF power modulation and phase delay, and gas chemistry modulation and phase delay) for quasi-ALD and quasi-ALE processes.

Plot 810 shows the standard transient gas exchange profile (i.e., gas mixture) between gas 1 and gas 2 over the period of time (T), that is essentially at a one-to-one ratio (e.g., 9× to 9×) between the gasses. The standard gas mixture is received from the gas box, and delivered to the gas valves for entry into the process chamber.

Plot 820 shows the transient, density controlled gas exchange profile (e.g., as implemented by mass flow controllers—MFCs), wherein the ratio of chemistries across the period of time (T) in plot 820 is similar to the ratio of chemistries in plot 810 (i.e., one-to-one ratio between the gasses). For instance, in time segment 820A that is repeatable, the ratio of gas 1 to gas 2 is two-to-one, wherein gas 1 is double the concentration of gas 2. In time segment 820B that is repeatable, the ratio of gas 1 to gas 2 is one-to two, wherein gas 2 is double the concentration of gas 1. Over the period of time (T), the ratio between the gasses is at a one-to-one ratio (e.g., 9× to 9×) because there are equal numbers of time segments 820A and time segments 820B.

Figure 9:
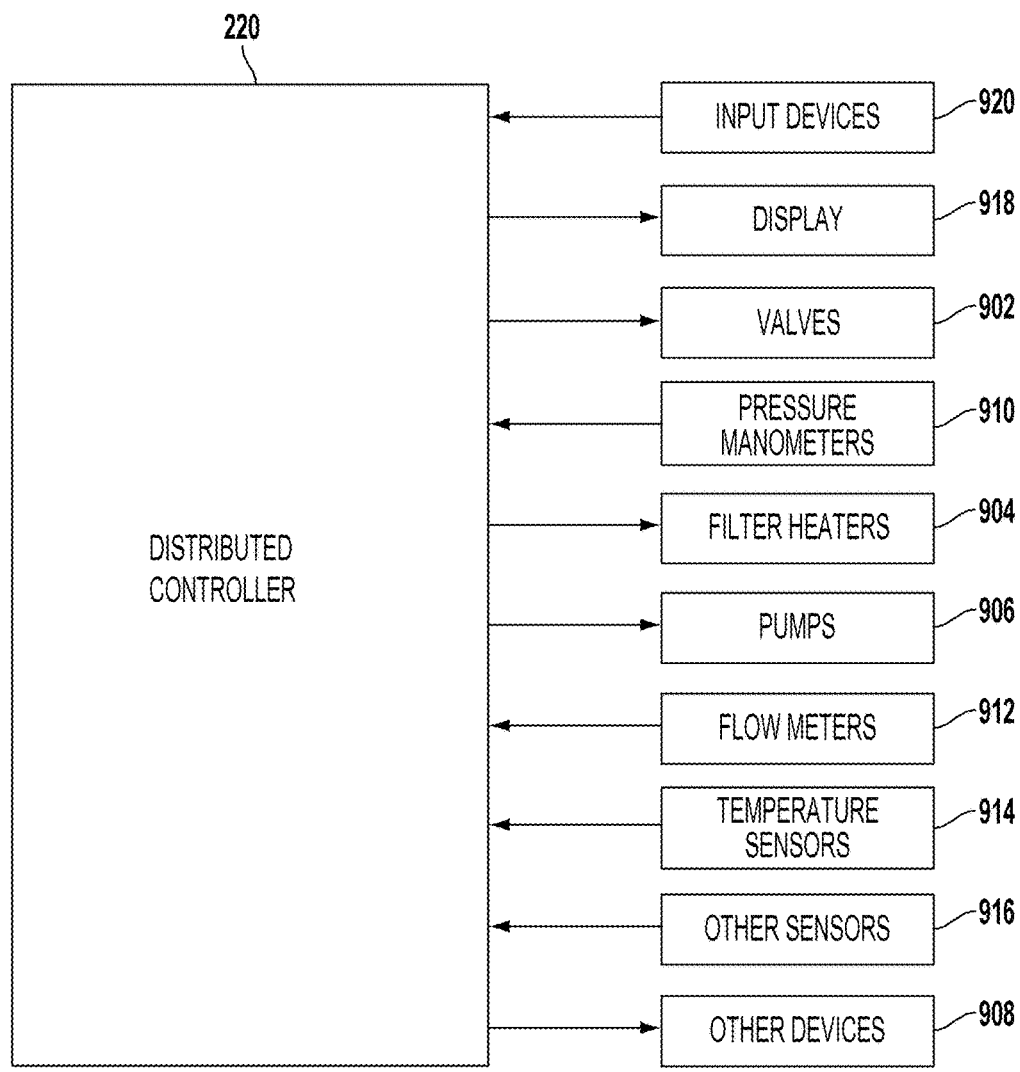
FIG. 9 shows a control module for controlling the systems described above.

FIG. 9 shows a distributed controller 220 for controlling the subsystems described above. In one embodiment, the distributed controllers 220, 220A and 220B of FIGS. 1, 2A-2B, and 3 may include some of the example components of the distributed controller shown in FIG. 9. For instance, the distributed controller 220 may include a processor, memory and one or more interfaces. The distributed controller 220 may be employed to control devices in the system based in part on sensed values. For example only, the distributed controller 220 may control one or more of valves 902, filter heaters 904, pumps 906, and other devices 908 based on the sensed values and other control parameters. The distributed controller 220 receives the sensed values from, for example only, pressure manometers 910, flow meters 912, temperature sensors 914, and/or other sensors 916. The distributed controller 220 may also be employed to control process conditions during precursor delivery and deposition of the film. The distributed controller 220 will typically include one or more memory devices and one or more processors.

The distributed controller 220 may control activities of the precursor delivery system and deposition apparatus. The distributed controller 220 executes computer programs including sets of instructions for controlling process timing, delivery system temperature, and pressure differentials across the filters, valve positions, mixture of gasses, chamber pressure, chamber temperature, substrate temperature, RF power levels, substrate chuck or pedestal position, and other parameters of a particular process. The distributed controller 220 may also monitor the pressure differential and automatically switch vapor precursor delivery from one or more paths to one or more other paths. Other computer programs stored on memory devices associated with the distributed controller 220 may be employed in some embodiments.

Typically there will be a user interface associated with the distributed controller 220. The user interface may include a display 918 (e.g., a display screen and/or graphical software displays of the apparatus and/or process conditions), and user input devices 920 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the substrate chuck.

Examples of sensors that may be monitored during deposition include, but are not limited to, mass flow control modules, pressure sensors such as the pressure manometers 910, and thermocouples located in delivery system, the pedestal or chuck (e.g., the temperature sensors 914). Appropriately programmed feedback and control algorithms may be used with data from these sensors to maintain desired process conditions. The foregoing describes implementation of embodiments of the disclosure in a single or multi-chamber semiconductor processing tool.

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gasses, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" of all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet.

The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A communications system for synchronizing control signals between a plurality of subsystems coupled to a process module used for processing a substrate, comprising:
   a distributed controller coupled to each of the plurality of subsystems and configured to initiate a plurality of process steps, each of the process steps having a step period, each step period having a plurality of fractions; and
   a distributed clock module including a master clock having a clock speed that includes a plurality of clock cycles, each clock cycle having a duration that is pre-correlated to a feedback loop within which synchronized control signals are delivered to and received from the plurality of subsystems by the distributed clock module, wherein the distributed clock module is configured to assign a predefined number of clock cycles for performing a corresponding number of feedback loops for transitioning between process steps,
   wherein the predefined number of clock cycles are restricted to a fraction of the step period.

2. The communications system of claim 1, wherein the corresponding number of feedback loops to be performed within the predefined number of clock cycles during a transition between two process steps includes:
   a setting feedback loop, the setting feedback loop performed within a first clock cycle of the master clock, the setting feedback loop configured for setting one or more control parameters of the plurality of subsystems; and
   a plurality of adjusting feedback loops, each adjusting feedback loop performed within one clock cycle of the master clock and performed after the setting feedback loop, each adjusting feedback loop configured for verifying the setting of the one or more control parameters and for adjusting the setting of the one or more control parameters.

3. The communications system of claim 2, wherein the corresponding number of feedback loops further comprises:
   a plurality of monitoring feedback loops performed after the plurality of adjusting feedback loops within the step period.

4. The communications system of claim 1, wherein the feedback loop includes:
   a first step of measuring a parameter controlled by the respective subsystem;
   a second step of processing the measured parameter;
   a third step of determining a change based on the processed measured parameter; and
   a fourth step of applying the change by sending a corresponding control signal to the respective subsystem within one cycle of a clock speed of the master clock.

5. The communications system of claim 1, wherein the feedback loop comprises a proportional-integral-derivative (PID) control loop.

6. The communications system of claim 1, wherein the plurality of process steps effects a deposition process with atomic layer precision without self-limiting reactions, the process steps comprising:
   an activation step; and
   a deposition step.

7. The communications system of claim 1, wherein the plurality of process steps effects an etching process with atomic layer precision without self-limiting reactions, the process steps comprising:
   an activation step; and
   an etching step.

8. The communications system of claim 1, wherein the clock speed is based on the predefined number of clock cycles to be performed during the fraction of the step period.

9. The communications system of claim 1, wherein the clock speed is calculated by the inverse of the time required to perform one feedback loop.

10. The communications system of claim 1, wherein a control signal delivered to a first subsystem is based on measurements of at least one parameter controlled by a second subsystem.

11. The communications system of claim 10, wherein the control signal is a RF power control signal delivered to at least one RF generator as the first subsystem, wherein the control signal is based on measurements of a first gas chemistry and a second gas chemistry within the process module, the first gas chemistry and the second gas chemistry used when performing the plurality of process steps and controlled by at least one gas supply manifold as the second subsystem.

12. The communications system of claim 1, wherein the distributed controller operates in compliance with a Versa Module Europa (VME) standard or one of its derivatives.

13. The communications system of claim 1, wherein the plurality of subsystems comprises at least two or more of the following:
   a gas supply manifold;
   an RF generator;
   a gap controller;
   a pressure controller;
   sensor system;
   bias compensation; and
   a temperature controller.

14. The communications system of claim 1, wherein the step period comprises one hundred fractions.

15. A communications system for synchronizing control signals between a plurality of subsystems coupled to a process module used for processing a substrate, comprising:
   a distributed controller coupled to each of the plurality of subsystems and configured to initiate a plurality of process steps, each of the process steps having a step period, each step period having a plurality of fractions, the distributed controller including a master clock having a clock speed that includes a plurality of clock cycles, each clock cycle having a duration that is pre-correlated to a feedback loop within which synchronized control signals are delivered to and received from the plurality of subsystems by the distributed controller, wherein the distributed controller is configured to assign a predefined number of clock cycles for performing a corresponding number of feedback loops for transitioning between process steps,
   wherein the predefined number of clock cycles are restricted to a fraction of the step period.

16. The communications system of claim 15, wherein the corresponding number of feedback loops to be performed within the predefined number of clock cycles during a transition between two process steps includes:
   a setting feedback loop, the setting feedback loop performed within a first clock cycle of the master clock, the setting feedback loop configured for setting one or more control parameters of the plurality of subsystems; and a plurality of adjusting feedback loops, each adjusting feedback loop performed within one clock cycle of the master clock and performed after the setting feedback loop, each adjusting feedback loop configured for verifying the setting of the one or more control parameters and for adjusting the setting of the one or more control parameters.

17. The communications system of claim 15, wherein the feedback loop includes:
a first step of measuring a parameter controlled by the respective subsystem;
a second step of processing the measured parameter;
a third step of determining a change based on the processed measured parameter; and
a fourth step of applying the change by sending a corresponding control signal to the respective subsystem within one cycle of a clock speed of the master clock.

18. The communications system of claim 15, wherein the plurality of process steps effects a deposition process with atomic layer precision without self-limiting reactions, the process steps comprising:
an activation step; and
a deposition step.

19. The communications system of claim 15, wherein the plurality of process steps effects an etching process with atomic layer precision without self-limiting reactions, the process steps comprising:
an activation step; and
an etching step.

20. The communications system of claim 15, wherein the clock speed is based on the predefined number of clock cycles to be performed during the fraction of the step period.

21. The communications system of claim 15, wherein a control signal delivered to a first subsystem is based on measurements of at least one parameter controlled by a second subsystem.

22. The system of claim 15, wherein a subsystem comprises at least two or more of the following:
a gas supply manifold;
an RF generator;
a gap controller;
a pressure controller;
sensor system;
bias compensation; and
a temperature controller.

23. The communications system of claim 15, wherein the step period comprises one hundred fractions.

24. A method for synchronizing control signals between a plurality of subsystems coupled to a process module used for processing a substrate, comprising:
initiating a plurality of process steps by a distributed controller, the process steps performed by the plurality of subsystems and controlled by the synchronized control signals, each of the process steps having a step period, each step period having a plurality of fractions;
configuring a master clock having a clock speed that includes a plurality of clock cycles, each clock cycle having a duration that is pre-correlated to a feedback loop within which the synchronized control signals are delivered to and received from the plurality of subsystems by the distributed controller;
assigning a predefined number of clock cycles for performing a corresponding number of feedback loops for transitioning between process steps; and
restricting the predefined number of clock cycles to a fraction of the step period.

25. The method of claim 24, wherein the performing the corresponding number of feedback loops for transitioning between process steps comprises:
performing a setting feedback loop, the setting feedback loop performed within a first clock cycle of the master clock, the setting feedback loop configured for setting one or more control parameters of the plurality of subsystems; and
performing a plurality of adjusting feedback loops, each adjusting feedback loop performed within one clock cycle of the master clock and performed after the setting feedback loop, each adjusting feedback loop configured for verifying the setting of the one or more control parameters and for adjusting the setting of the one or more control parameters.

26. The method of claim 24, further comprising performing the feedback loop, wherein the performing comprises:
measuring a parameter controlled by the respective subsystem;
processing the measured parameter;
determining a change based on the processed measured parameter; and
applying the change by sending a corresponding control signal to the respective subsystem within one cycle of a clock speed of the master clock.

27. The method of claim 24, further comprising:
effecting a deposition process with atomic layer precision without self-limiting reactions in the plurality of process steps, the process steps including an activation step, and a deposition step.

28. The method of claim 24, further comprising:
effecting an etching process with atomic layer precision without self-limiting reactions in the plurality of process steps, the process steps including an activation step, and an etching step.

29. The method of claim 24, further comprising:
generating a control signal delivered to a first subsystem based on measurements of at least one parameter controlled by a second subsystem.

30. The method of claim 24, wherein the step period comprises one hundred fractions.

* * * * *